US012713700B2

(12) United States Patent
Shin et al.

(10) Patent No.: US 12,713,700 B2
(45) Date of Patent: Aug. 18, 2026

(54) DISPLAY DEVICE INCLUDING PARALLEL-CONNECTED STORAGE CAPACITOR

(71) Applicant: Samsung Display Co., LTD., Yongin-si (KR)

(72) Inventors: Dong Hee Shin, Yongin-si (KR); Sun Kwun Son, Yongin-si (KR); No Kyung Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 493 days.

(21) Appl. No.: 18/358,301

(22) Filed: Jul. 25, 2023

(65) Prior Publication Data

US 2024/0038785 A1 Feb. 1, 2024

(30) Foreign Application Priority Data

Aug. 1, 2022 (KR) ........................ 10-2022-0095639

(51) Int. Cl.

*H10D 86/60* (2025.01)
*H10D 86/40* (2025.01)
*H10H 20/857* (2025.01)
*H10W 90/00* (2026.01)

(52) U.S. Cl.

CPC ........... *H10D 86/60* (2025.01); *H10D 86/481* (2025.01); *H10H 20/857* (2025.01); *H10W 90/00* (2026.01)

(58) Field of Classification Search

CPC .... H10D 86/60; H10D 86/481; H10D 86/441; H01L 25/167; H01L 25/0753; H10H 20/857; H10H 20/83; H10H 20/851; G09G 3/32; G09G 2300/0426; G09G 2300/0842

See application file for complete search history.

(56) References Cited

U.S. PATENT DOCUMENTS

| | | | |
|---|---|---|---|
| 9,276,051 | B2 | 3/2016 | Sato |
| 9,324,740 | B2 | 4/2016 | Lee et al. |
| 10,084,031 | B2 | 9/2018 | Park et al. |

(Continued)

FOREIGN PATENT DOCUMENTS

| | | |
|---|---|---|
| KR | 10-2018-0036818 A | 4/2018 |
| KR | 10-2018-0076828 A | 7/2018 |

(Continued)

*Primary Examiner* — Tan N Tran

(74) *Attorney, Agent, or Firm* — Womble Bond Dickinson (US) LLP

(57) ABSTRACT

A display device includes a semiconductor pattern. A first capacitor electrode under the semiconductor pattern. A second capacitor electrode on the semiconductor pattern, the second capacitor electrode including a portion forming a gate electrode. A first electrode and a second electrode at a same layer on the second capacitor electrode. At least one light emitting element between the first electrode and the second electrode. A first pixel electrode on the first electrode and connected to a first end of the at least one light emitting element. A second pixel electrode on the second electrode and connected to a second end of the at least one light emitting element. The first electrode is connected to the first capacitor electrode and the semiconductor pattern. The semiconductor pattern and the gate electrode form a transistor. A first capacitor is formed by the first and second capacitor electrodes.

20 Claims, 15 Drawing Sheets

(56) References Cited

U.S. PATENT DOCUMENTS

| | | | | |
|---|---|---|---|---|
| 10,510,302 | B2 | 12/2019 | Yoo et al. | |
| 10,985,068 | B2 * | 4/2021 | Lee | H10D 84/01 |
| 11,282,909 | B2 | 3/2022 | Liu et al. | |
| 11,705,439 | B2 * | 7/2023 | Meitl | H10H 20/857 257/89 |
| 11,984,537 | B2 | 5/2024 | Bae et al. | |
| 12,477,919 | B2 * | 11/2025 | Li | H10K 59/38 |
| 2021/0265329 | A1 | 8/2021 | Woo et al. | |
| 2025/0185476 | A1 * | 6/2025 | Zhang | H10K 59/80522 |

FOREIGN PATENT DOCUMENTS

| | | | |
|---|---|---|---|
| KR | 10-1974700 | B1 | 4/2019 |
| KR | 10-2124025 | B1 | 6/2020 |
| KR | 10-2021-0107208 | A | 9/2021 |
| KR | 10-2021-0119951 | A | 10/2021 |
| KR | 10-2021-0157949 | A | 12/2021 |

* cited by examiner

SPX1 SPX2 SPX3

PL1_V SL1 D1 PL1_V SL2 D2 PL1_V SL3 D3 PL2_V

PL2_H
BRP3
BRP2
ACT3
SC
T3 T2
ACT2
C1 CE2
CE1
I'
ACT1
T1
BRP1
PL1_H

PL1: PL1_H, PL1_V
PL2: PL2_H, PL2_V
PXL: SPX1, SPX2, SPX3

PXL
SPX1
SPX2
SPX3
NEA
EMA
CF1
CF2
CF3
OC
PLA
CAP2
LRL
CAP1
SUB/PCL
WCP
WCP1
WCP2
LD
LTP
BNK
UFL
CFL
OPL
DPL/CCL
DR1
DR2
DR3

PXL
SPX1
SPX2
SPX3
NEA
EMA
NEA
EMA
NEA
EMA
NEA
CF1
CF2
CF3
UFL
CFL
OPL
CCL
DPL
OC
PLA
CAP3
LRL
CAP2
LBL
CAP1
SUB/PCL
WCP1
LD
BNK
WCP2
LD
LTP
LD
DR3
DR1
DR2
WCP
WCP1
WCP2

DISPLAY DEVICE INCLUDING PARALLEL-CONNECTED STORAGE CAPACITOR

CROSS-REFERENCE TO RELATED APPLICATION

This application claims priority to and the benefit of Korean Patent Application No. 10-2022-0095639, filed on Aug. 1, 2022, in the Korean Intellectual Property Office, the entire disclosure of which is incorporated by reference herein.

BACKGROUND

1. Field

One or more embodiments of the present disclosure relate to a display device.

2. Description of Related Art

With an increase in interest in an information display and an increase in demand to use portable information media, demand for display devices is markedly increased, and commercialization thereof is in progress.

SUMMARY

Various embodiments of the present disclosure are directed to a display device having improved display quality.

One or more embodiments of the present disclosure may provide a display device including: a semiconductor pattern; a first capacitor electrode under the semiconductor pattern; a second capacitor electrode on the semiconductor pattern, the second capacitor electrode including a portion forming a gate electrode; a first electrode and a second electrode at a same layer on the second capacitor electrode; at least one light emitting element between the first electrode and the second electrode; a first pixel electrode on the first electrode and connected to a first end of the at least one light emitting element; and a second pixel electrode on the second electrode and connected to a second end of the at least one light emitting element. The first electrode may be electrically connected to the first capacitor electrode and the semiconductor pattern. The semiconductor pattern and the gate electrode may form a transistor. A first capacitor may be formed by the first capacitor electrode and the second capacitor electrode. A second capacitor may be formed by the second capacitor electrode and the first electrode.

A signal line and a power line may not be at a layer between the second capacitor electrode and the first electrode.

At least one of a source electrode and a drain electrode of the transistor may be at a same layer as the second capacitor electrode.

A data line connected to the transistor is at a same layer as the first capacitor electrode.

The power line connected to the transistor may be at a same layer as at least one of the first capacitor electrode or the second capacitor electrode.

The first pixel electrode may be electrically connected to the transistor by the first electrode.

The display device may further include a bridge electrode at a same layer as the first electrode and the second electrode, and spaced from the first electrode and the second electrode. The second pixel electrode may be connected to a power line by the bridge electrode.

In a plan view, the second electrode may extend over a plurality of sub-pixels. Each of the first electrode and the bridge electrode has an island shape in each of the sub-pixels.

A first insulating layer may be on the first electrode and the second electrode. The first insulating layer may not be in a boundary area between two adjacent sub-pixels from among a plurality of sub-pixels.

In a plan view, the first electrode may cover the first capacitor electrode and the second capacitor electrode.

The first electrode may be connected to the first capacitor electrode and the semiconductor pattern through an opening of the second capacitor electrode.

The display device may further include: a wavelength conversion pattern on the at least one light emitting element, and configured to convert a wavelength band of light that is incident thereon from the at least one light emitting element to a desired wavelength band and emit the light; and a color filter on the wavelength conversion pattern.

The at least one light emitting element may include inorganic light emitting diodes connected in parallel to each other.

A display device in accordance with one or more embodiments of the present disclosure may include: a semiconductor pattern; a first capacitor electrode under the semiconductor pattern; a gate electrode on the semiconductor pattern; a first electrode and a second electrode at a same layer on the gate electrode; at least one light emitting element between the first electrode and the second electrode; a first pixel electrode on the first electrode and connected to a first end of the at least one light emitting element; and a second pixel electrode on the second electrode and connected to a second end of the at least one light emitting element. The first electrode may be electrically connected to the first capacitor electrode and the semiconductor pattern. The semiconductor pattern and the gate electrode may form a transistor. A portion of the semiconductor pattern doped with an impurity may form a second capacitor electrode. A first capacitor may be formed by the first capacitor electrode and the second capacitor electrode. A second capacitor may be formed by the second capacitor electrode and the first electrode that overlaps the second capacitor electrode.

The gate electrode may be electrically connected to the second capacitor electrode.

A signal line and a power line may not be at a layer between the second capacitor electrode and the gate electrode.

Each of a data line and the power line that are connected to the transistor may be at a same layer as at least one of the first capacitor electrode or the second capacitor electrode.

The display device may further include a bridge electrode at a same layer as the first electrode and the second electrode, and spaced from the first electrode and the second electrode. The second pixel electrode may be connected to a power line by the bridge electrode.

A first insulating layer may be on the first electrode and the second electrode. The first insulating layer may not be at a boundary area between two adjacent sub-pixels from among a plurality of sub-pixels.

In a plan view, the first electrode may cover the first capacitor electrode and the second capacitor electrode.

DETAILED DESCRIPTION

Figure 1:
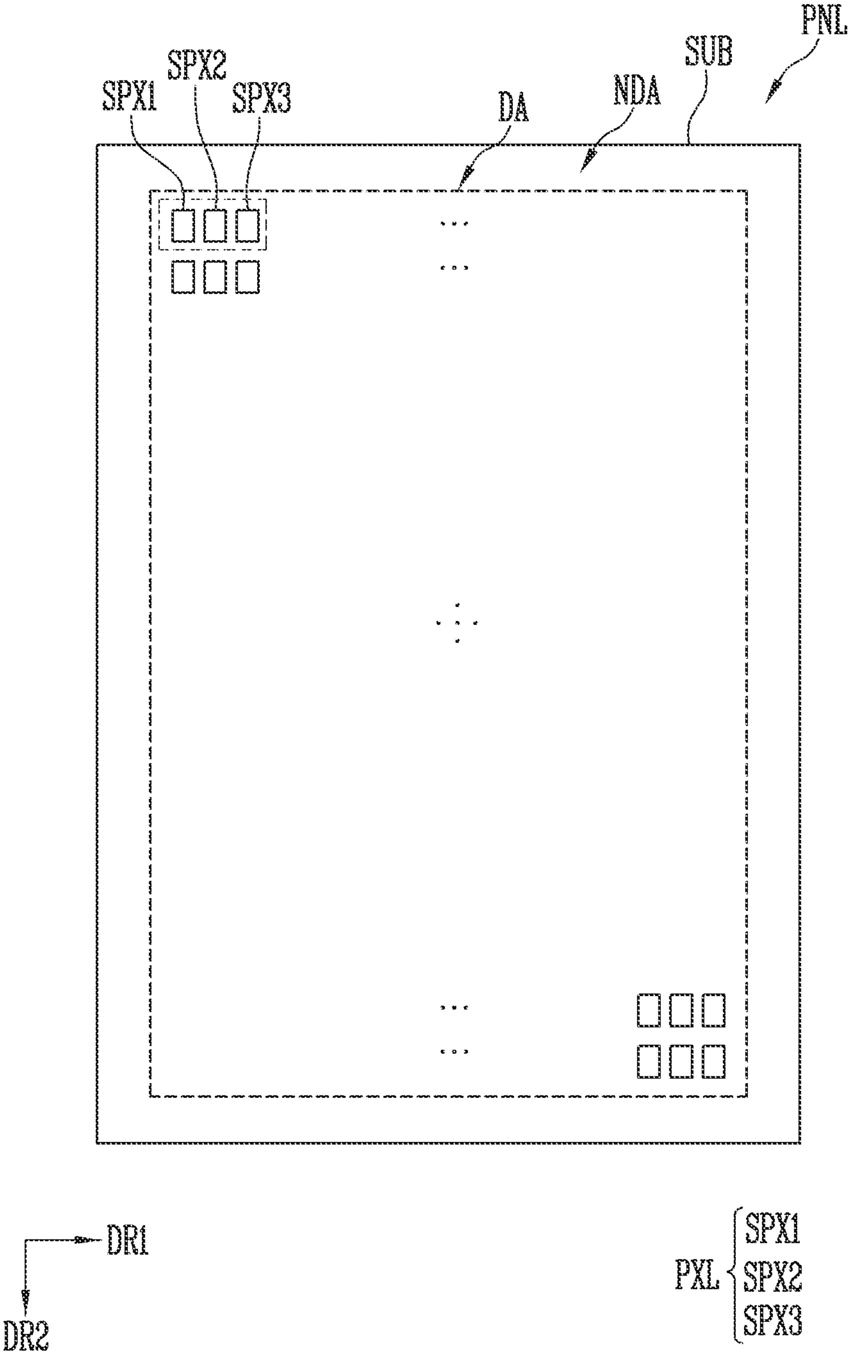
FIG. 1 is a plan view illustrating a display device in accordance with one or more embodiments of the present disclosure.

As the present disclosure allows for various changes and numerous embodiments, particular embodiments will be illustrated in the drawings and described in detail in the written description. However, this is not intended to limit the present disclosure to particular modes of practice, and it is to be appreciated that all changes, equivalents, and substitutes that do not depart from the spirit and technical scope of the present disclosure are encompassed in the present disclosure.

It will be understood that, although the terms "first", "second", etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element. In the present disclosure, the singular forms are intended to include the plural forms as well, unless the context clearly indicates otherwise.

It will be further understood that the terms "comprise", "include", "have", etc. when used in this specification, specify the presence of stated features, integers, steps, operations, elements, components, and/or combinations of them but do not preclude the presence or addition of one or more other features, integers, steps, operations, elements, components, and/or combinations thereof. Furthermore, in case that a first part such as a layer, a film, a region, or a plate is disposed on a second part, the first part may be not only directly on the second part but a third part may intervene between them. In addition, when it is expressed that a first part such as a layer, a film, a region, or a plate is formed on a second part, the surface of the second part on which the first part is formed is not limited to an upper surface of the second part but may include other surfaces such as a side surface or a lower surface of the second part. To the contrary, in case that a first part such as a layer, a film, a region, or a plate is under a second part, the first part may be not only directly under the second part but a third part may intervene between them.

Aspects, effects, and features of the present disclosure, and methods for achieving the same will become clear with reference to embodiments described later in detail together with the accompanying drawings. However, it is to be noted that the present disclosure is not limited to the embodiments but can be embodied in various other ways. In this specification, "connected/coupled" refers to one component not only directly coupling another component but also indirectly coupling another component through an intermediate component. In addition, in one or more embodiments of the present disclosure, the term "connection" between two components may embrace electrical connection and physical connection.

Hereinafter, a display device in accordance with one or more embodiments of the present disclosure will be described with reference to the attached drawings.

FIG. 1 is a plan view illustrating a display device in accordance with one or more embodiments of the present disclosure. FIG. 1 illustrates a display panel PNL provided in the display device.

FIG. 1 illustrates the structure of the display panel PNL in accordance with one or more embodiments, focused on a display area DA. In one or more embodiments, at least one driving circuit (e.g., at least one of a scan driver or a data driver), lines, and/or pads may be further provided on the display panel PNL.

Referring to FIG. 1, the display panel PNL may include a substrate SUB, and a pixel PXL disposed on the substrate SUB.

The substrate SUB (or a base layer) may form a base of the display panel PNL and may be a rigid or flexible substrate or film. For example, the substrate SUB may be a rigid substrate made of glass or reinforced glass, a flexible substrate (or a thin film) formed of plastic or metal, or at least one insulating layer. The material and/or properties of the substrate SUB is not particularly limited.

In one or more embodiments, the substrate SUB may be substantially transparent. Here, the words "substantially transparent" may mean that light can pass through the substrate SUB with a certain transmissivity or more. In one or more embodiments, the substrate SUB may be translucent or opaque. Furthermore, the substrate SUB may include a reflective material in some embodiments.

The display panel PNL and the substrate SUB for forming the display panel PNL may include a display area DA for displaying an image, and a non-display area NDA other than the display area DA. The non-display area NDA may be around the display area DA along an edge or periphery of the display area DA.

The pixel PXL may be disposed in the display area DA. Various lines, pads, and/or internal circuits that are connected to the pixel PXL of the display area DA may be disposed in the non-display area NDA.

For example, the pixel PXL may include sub-pixels SPX1 to SPX3. For example, the pixel PXL may include a first sub-pixel SPX1, a second sub-pixel SPX2, and a third sub-pixel SPX3.

Each of the sub-pixels SPX1 to SPX3 may emit a certain color of light. In one or more embodiments, the sub-pixels SPX1 to SPX3 may emit different colors of light. For example, the first sub-pixel SPX1 may emit a first color of light. The second sub-pixel SPX2 may emit a second color of light. The third sub-pixel SPX3 may emit a third color of light. For example, the first sub-pixel SPX1 may be a red pixel configured to emit red light, the second sub-pixel SPX2 may be a green pixel configured to emit green light, and the third sub-pixel SPX3 may be a blue pixel configured to emit blue light. However, the present disclosure is not limited thereto.

In one or more embodiments, the first sub-pixel SPX1, the second sub-pixel SPX2, and the third sub-pixel SPX3 may respectively include, as light sources, a light emitting element related to the first color, a light emitting element related to the second color, and a light emitting element related to the third color, so that the first, second, and third sub-pixels SPX1, SPX2, and SPX3 may respectively emit the first color of light, the second color of light, and the third color of light. In one or more embodiments, the first sub-pixel SPX1, the second sub-pixel SPX2, and the third sub-pixel SPX3 may respectively include light emitting elements configured to emit the same color of light, and color conversion layers (or wavelength conversion layers) and/or color filters related to different colors may be disposed on the respective light emitting elements so that the first, second, and third sub-pixels SPX1, SPX2, and SPX3 may respectively emit the first color of light, the second color of light, and the third color of light. However, the colors, the types, and/or the number of sub-pixels SPX1 to SPX3 that form each pixel PXL are not particularly limited. In other words, the color of light to be emitted from each pixel PXL may be changed in various ways.

The sub-pixels SPX1 to SPX3 may be regularly arranged according to a stripe or PENTILE® arrangement structure, or the like. The PENTILE® pixel arrangement structure may be referred to as an RGBG matrix structure (e.g., a PENTILE® matrix structure or an RGBG structure (e.g., a PENTILE® structure)). PENTILE® is a registered trademark of Samsung Display Co., Ltd., Republic of Korea. However, the arrangement structure of the sub-pixels SPX1 to SPX3 is not limited thereto, and the sub-pixels SPX1 to SPX3 may be arranged in the display area DA by using various structures and/or methods. For example, the first, second, and third sub-pixels SPX1, SPX2, and SPX3 may be sequentially repeatedly disposed along a first direction DR1, and also be repeatedly disposed along a second direction DR2. At least one first sub-pixel SPX1, at least one second sub-pixel SPX2, and at least one third sub-pixel SPX3 that are disposed adjacent to each other may form one pixel PXL that may emit various colors of light. The arrangement structure of the sub-pixels SPX1 to SPX3 is not limited thereto, and the sub-pixels SPX1 to SPX3 may be arranged in the display area DA in various structures and/or schemes.

In one or more embodiments, each of the sub-pixels SPX1 to SPX3 may be formed of an active pixel. For example, each of the sub-pixels SPX1 to SPX3 may include at least one light source (e.g., a light emitting element) that is driven by a control signal (e.g., a scan signal and a data signal) and/or a power supply (e.g., a first power supply and a second power supply). However, the types, structures, and/or driving schemes of the sub-pixels SPX1 to SPX3 applicable to the display device are not particularly limited.

FIGS. 2A, 2B, 2C, and 2D are circuit diagrams illustrating one or more embodiments of a sub-pixel SPX included in the display device of FIG. 1.

In one or more embodiments, the sub-pixel SPX illustrated in FIGS. 2A to 2D may be any one of the first sub-pixel SPX1, the second sub-pixel SPX2, and the third sub-pixel SPX3 that are provided in the display panel PNL of FIG. 1. The first sub-pixel SPX1, the second sub-pixel SPX2, and the third sub-pixel SPX3 may have a substantially identical or similar structure.

Referring to FIGS. 2A to 2D, the sub-pixel SPX may include a light source unit LSU configured to generate light having a luminance corresponding to a data signal, and a pixel circuit PXC configured to drive the light source unit LSU.

The light source unit LSU may include at least one light emitting element LD that is electrically connected between the first power supply VDD and the second power supply VSS. The first power supply VDD and the second power supply VSS may have different potentials to allow the light emitting element LD to emit light. For example, the first power supply VDD may be set as a high-potential power supply, and the second power supply VSS may be set as a low-potential power supply. Here, a difference in potential between the first power supply VDD and the second power supply VSS may be set to a threshold voltage of the light emitting element LD or more during at least an emission period of the sub-pixel SPX.

The light emitting element LD may emit light having a luminance corresponding to driving current supplied thereto through the pixel circuit PXC. The light emitting element LD may be formed of an inorganic light emitting diode such as a micro light emitting diode, or a quantum dot light emitting diode. In one or more embodiments, the light emitting element LD may be formed of a light emitting diode that is made of a material having an inorganic crystal structure and has a subminiature size, e.g., ranging from the nanometer scale to the micrometer scale. The present disclosure is not limited thereto, and the light emitting element may be formed of an organic light emitting diode.

In one or more embodiments, the light source unit LSU may include a plurality of light emitting elements LD connected in parallel to each other.

Figure 2A:
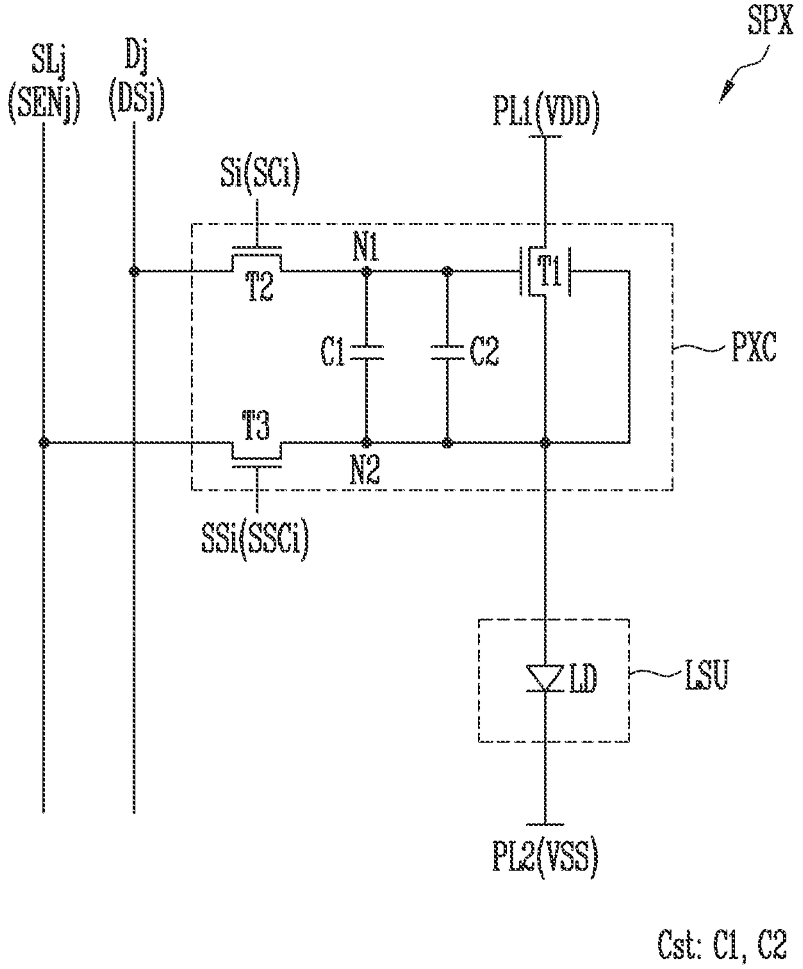
FIGS. 2A, 2B, 2C, and 2D are circuit diagrams illustrating one or more embodiments of a sub-pixel included in the display device of FIG. 1.
Figure 2B:
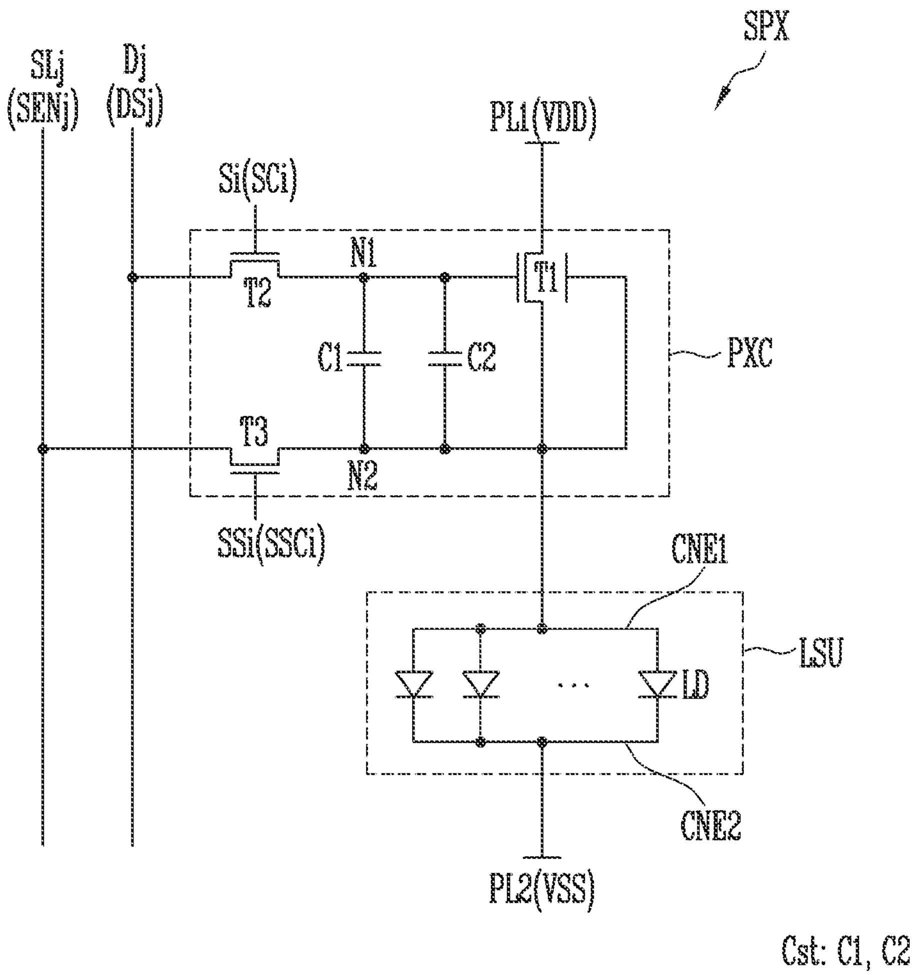

As illustrated in FIG. 2B, the light source unit LSU may include a first electrode CNE1 that is electrically connected to the first power supply VDD via the pixel circuit PXC and the first power line PL1, a second electrode CNE2 that is electrically connected to the second power supply VSS through the second power line PL2, and a plurality of light emitting elements LD that are electrically connected to each other in the same direction between the first and second electrodes CNE1 and CNE2. In one or more embodiments, the first electrode CNE1 (or a first pixel electrode) may be an anode electrode or correspond to the anode electrode. The second electrode CNE2 (or a second pixel electrode) may be a cathode electrode or correspond to the cathode electrode.

Each of the light emitting elements LD may include a first end (e.g., a p-type end) electrically connected to the first power supply VDD by the first electrode CNE1 and/or the pixel circuit PXC, and a second end (e.g., an n-type end) electrically connected to the second power supply VSS by the second electrode CNE2. In other words, the light emitting element LD may be connected in parallel in a forward direction between the first and second electrodes CNE1 and CNE2. Each light emitting element LD connected in the forward direction between the first power supply VDD and the second power supply VSS may be grouped to form a valid light source. Such valid light sources may form the light source unit LSU of the pixel PXL.

The first ends (e.g., the p-type ends) of the light emitting elements LD may be connected in common to the pixel circuit PXC by one electrode (e.g., the first electrode CNE1) of the light source unit LSU, and may be electrically connected to the first power supply VDD by the pixel circuit PXC and the first power line PL1. The second ends (e.g., the n-type ends) of the light emitting elements LD may be connected in common to the second power supply VSS by the second power line PL2 and the other electrode (e.g., the second electrode CNE2) of the light source unit LSU.

In one or more embodiments, the light source unit LSU may include a plurality of light emitting elements LD connected in series to each other. For example, the light source unit LSU may include light emitting elements LD that form at least two series sets and are connected in series/parallel to each other.

Figure 2C:
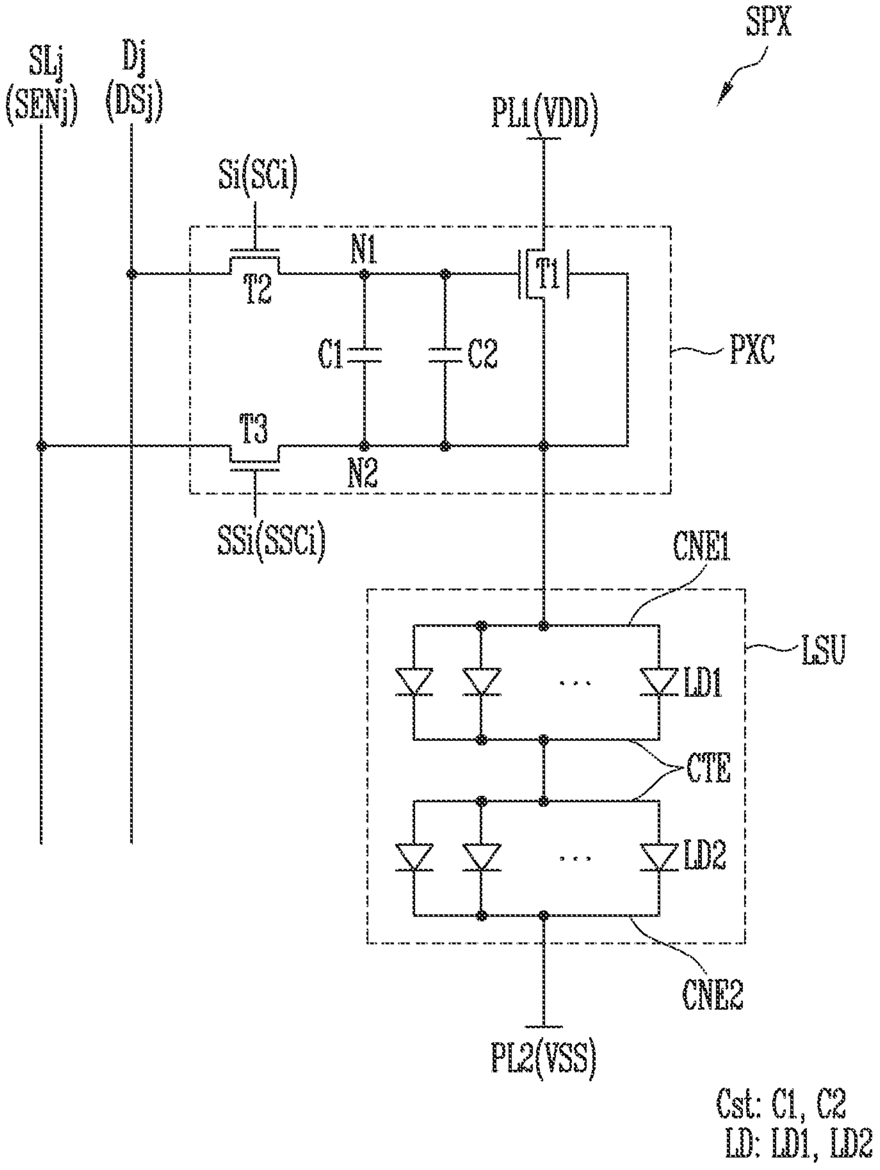

As illustrated FIG. 2C, the light source unit LSU may include light emitting elements LD that form two series sets and are connected in series/parallel to each other. In this case, each series set may include a pair of electrodes (e.g., two electrodes), and at least one light emitting element LD electrically connected between the pair of electrodes. Here, the numbers of light emitting elements LD that form the respective series sets may be identical to or different from each other. The number of light emitting elements LD of each series set is not particularly limited. For example, a first series set may include at least one first light emitting element LD1 that is electrically connected between the first electrode CNE1 and an intermediate electrode CTE (or a third electrode). A second series set may include at least one second light emitting element LD2 that is electrically connected between the intermediate electrode CTE and the second electrode CNE2.

Figure 2D:
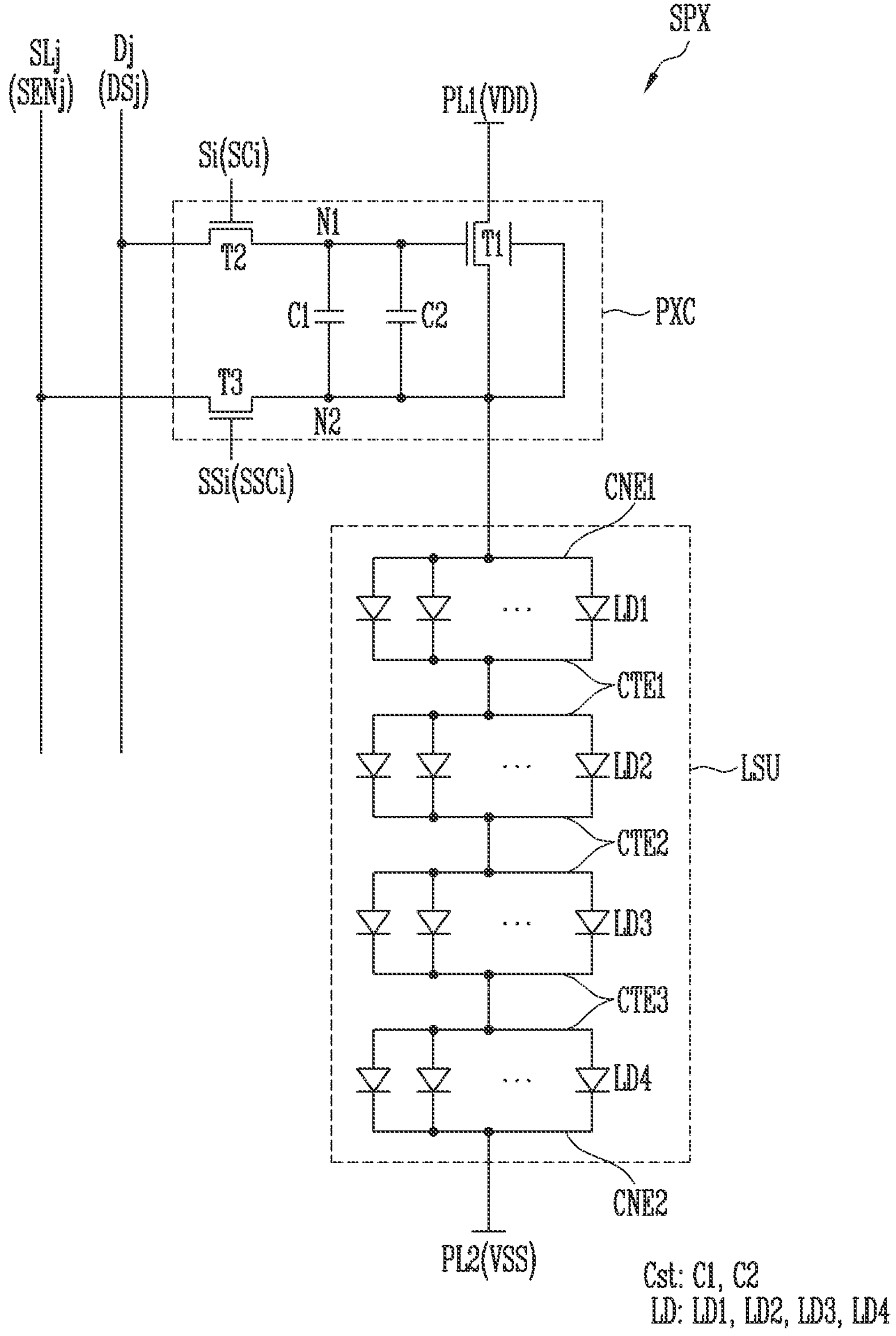

As illustrated FIG. 2D, the light source unit LSU may include light emitting elements LD that form four series sets and are connected in series/parallel to each other. For example, the first series set may include at least one first light emitting element LD1 that is electrically connected between the first electrode CNE1 and a first intermediate electrode CTE1. The second series set may include at least one second light emitting element LD2 that is electrically connected between the first intermediate electrode CTE1 and a second intermediate electrode CTE2. The third series set may include at least one third light emitting element LD3 that is electrically connected between the second intermediate electrode CTE2 and a third intermediate electrode CTE3. The fourth series set may include at least one fourth light emitting element LD4 that is electrically connected between the third intermediate electrode CTE3 and the second electrode CNE2.

On the assumption that the light source unit LSU is configured using the light emitting elements LD having the same conditions (e.g., the same size and/or number) as valid light sources, if the light emitting elements LD are connected to each other in a series or series/parallel combination structure, the power efficiency can be enhanced. For example, in the light source unit LSU in which the light emitting elements LD are connected in series or series/parallel structure, the luminance to be expressed based on the same current may be higher than that of the case where the light emitting elements LD are connected only in parallel to each other. Furthermore, in the light source unit LSU in which the light emitting elements LD are connected in series or series/parallel structure, driving current needed to express the same luminance may be reduced, compared to that of the case where the light emitting elements LD are connected in parallel to each other. Furthermore, in the sub-pixel SPX in which the light emitting elements LD are connected in series or in a series/parallel combination structure, even if a short-circuit defect or the like occurs in some series sets, a certain degree of luminance can be expressed by the light emitting elements LD of the other series sets, so that the probability of occurrence of a black spot defect in the sub-pixel SPX can be reduced.

The pixel circuit PXC may be electrically connected between the first power supply VDD and the light source unit LSU. The pixel circuit PXC may be electrically connected to a scan line Si (or a gate line) and a data line Dj. Furthermore, the pixel circuit PXC may be further electrically connected to a sensing control line SSi and a sensing line SLj. For example, if the sub-pixel SPX is disposed on an i-th (i is a natural number) horizontal line (or row, or pixel row) and a j-th (j is a natural number) vertical line (or column, or pixel column) of the display area DA, the pixel circuit PXC of the sub-pixel SPX may be electrically connected to an i-th scan line Si, an i-th sensing control line SSi, a j-th data line Dj, and the sensing line SLj of the display area DA.

In one or more embodiments, the pixel circuit PXC may include a plurality of transistors and at least one capacitor. For example, the pixel circuit PXC may include a first transistor T1, a second transistor T2, a third transistor T3, and a storage capacitor Cst (e.g., C1 and C2).

The first transistor T1 may be electrically connected between the first power supply VDD and the light source unit LSU. For example, a first electrode (or a first terminal, a first transistor electrode, e.g., a drain electrode) of the first transistor T1 may be electrically connected to the first power supply VDD. A second electrode (or a second terminal, a second transistor electrode, e.g., a source electrode) of the first transistor T1 may be electrically connected to an end (e.g., an anode electrode) of the light source unit LSU. A gate electrode of the first transistor T1 is electrically connected to a first node N1. A back gate electrode of the first transistor T1 may be electrically connected to a second node N2. The first transistor T1 may control driving current to be supplied to the light source unit LSU in response to the voltage of the first node N1. In other words, the first transistor T1 may be a driving transistor configured to control the driving current of the sub-pixel SPX.

The second transistor T2 may be electrically connected between the data line Dj and the first node N1. For example, a first electrode of the second transistor T2 may be electrically to the data line Dj, and a second electrode of the second transistor T2 may be electrically connected to the first node N1. A gate electrode of the second transistor T2 is electrically connected to the scan line Si. When a scan signal SCi having a gate-on voltage (e.g., a high level voltage) is supplied from the scan line Si, the second transistor T2 may be turned on to electrically connect the first node N1 to the data line Dj. During each frame period, a data signal DSj of a corresponding frame is supplied to the data line Dj, and the data signal DSj is transmitted to the first node N1 through the second transistor T2 that is turned on during a period in which the scan signal SCi having a gate-on voltage is supplied. In other words, the second transistor T2 may be a switching transistor configured to transmit each data signal DSj to the interior of the sub-pixel SPX.

The third transistor T3 is electrically connected between the first transistor T1 and the sensing line SLj. For example, a first electrode of the third transistor T3 may be electrically connected to the sensing line SLj. A second electrode of the third transistor T3 may be electrically connected to the second node N2 (or the second electrode of the first transistor T1). A gate electrode of the third transistor T3 is connected to the sensing control line SSi. In the case in which the sensing control line SSi is omitted, the gate electrode of the third transistor T3 may be connected to the scan line Si (or a preceding scan line located on a row preceding the scan line Si, or a subsequent scan line following the scan line Si). The third transistor T3 may be turned on by a sensing control signal SSCi that has a gate-on voltage and is supplied to the sensing control line SSi during a certain sensing period, so that the sensing line SLj and the first transistor T1 can be electrically connected to each other. In one or more embodiments, a certain reference voltage (or an initialization voltage) may be applied to the sensing line SLj. The reference voltage may have a voltage level between the voltage of the first power supply VDD and the voltage of the second power supply VSS, but the present disclosure is not limited thereto.

The storage capacitor Cst (e.g., C1 and C2) may be formed or electrically connected between the first node N1 and the second node N2. The storage capacitor Cst (e.g., C1 and C2) may be charged with a voltage corresponding to a data signal DSj to be supplied to the first node N1 during each frame period.

In one or more embodiments, the storage capacitor Cst may include a first capacitor C1 and a second capacitor C2 that are separated from each other. The first capacitor C1 and the second capacitor C2 may be connected in parallel to each other between the first node N1 and the second node N2. A first electrode of each of the first capacitor C1 and the second capacitor C2 may be electrically connected to the second node N2. A second electrode of each of the first capacitor C1 and the second capacitor C2 may be electrically connected to the first node N1.

Although will be described below with reference to FIG. 6, the first capacitor C1 and the second capacitor C2 may overlap each other. The storage capacitor Cst may include the first capacitor C1 and the second capacitor C2 in lieu of one capacitor, thus having maximized capacitance in limited space (or planar space).

For reference, a parasitic capacitor (or parasitic capacitance) may be formed between the first node N1 and a signal line and/or a power line adjacent to the first node N1, or the first node N1 may be coupled to the signal line and/or the power line. The parasitic capacitor or the coupling may affect the voltage (or variation in voltage) of the first node N1, so that the sub-pixel SPX may not emit light at a desired luminance. In the case where the capacitance of the storage capacitor Cst is maximized by the first capacitor C1 and the second capacitor C2, influence of a parasitic capacitor formed between the first node N1 and other signal lines and/or the power line (e.g., the first power line PL1) may be mitigated or removed. In the case where the influence of the parasitic capacitor is removed, the sub-pixel SPX may accurately emit light at a desired luminance, and the quality of an image displayed on the display device can be enhanced.

Although FIGS. 2A to 2D illustrate that the transistors, e.g., the first, second, and third transistors T1, T2, and T3, included in the pixel circuit PXC are N-type transistors, the present disclosure is not limited thereto. At least one of the first transistor T1, the second transistor T2, or the third transistor T3 may be changed to a P-type transistor. In addition, the pixel circuit PXC may be formed of a pixel circuit that may have various structures and/or be operated by various driving schemes.

Figure 3:
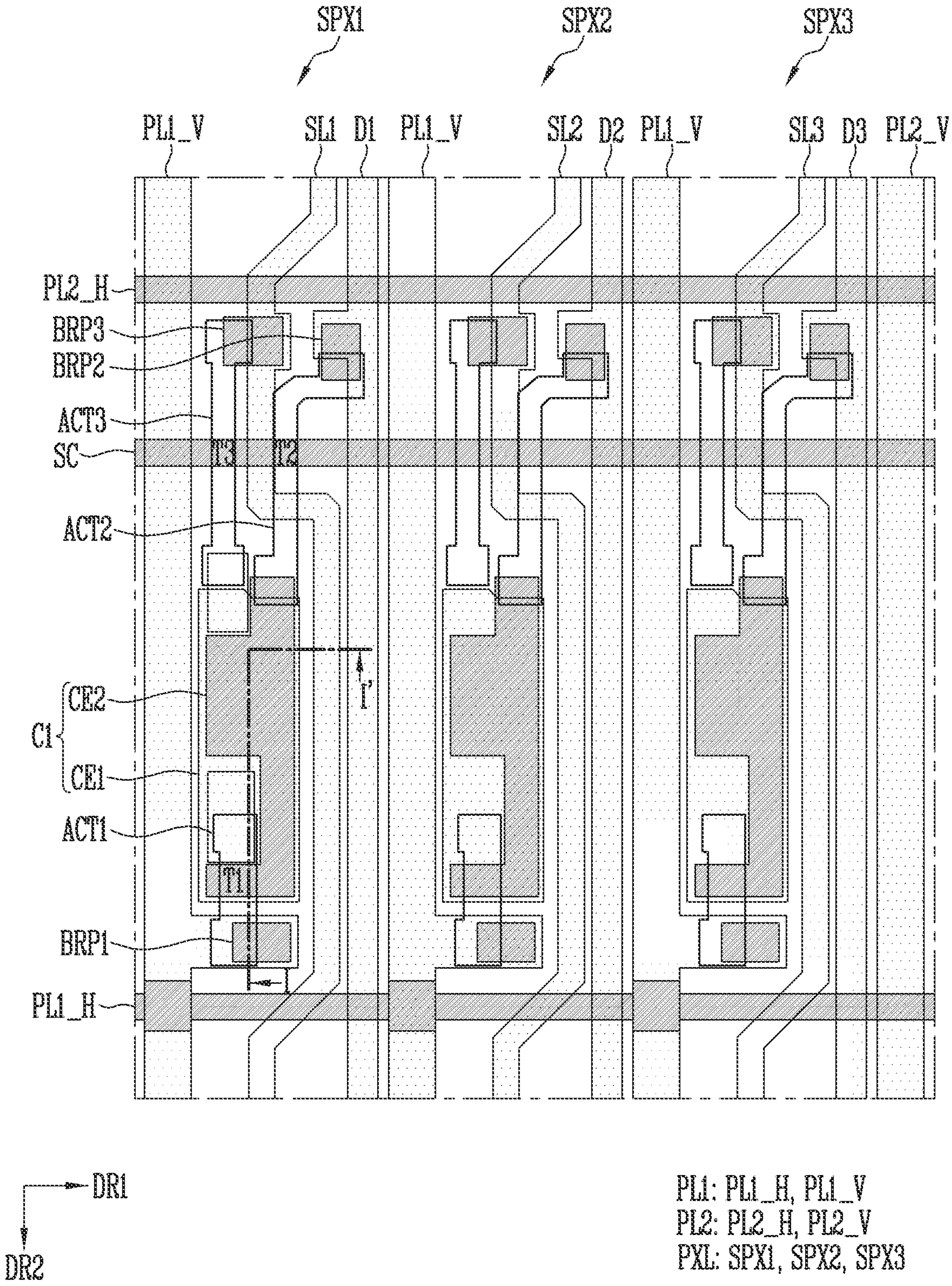
FIGS. 3 and 4 are layout diagrams each illustrating an embodiment of the pixel included in the display device of FIG. 1.
Figure 4:
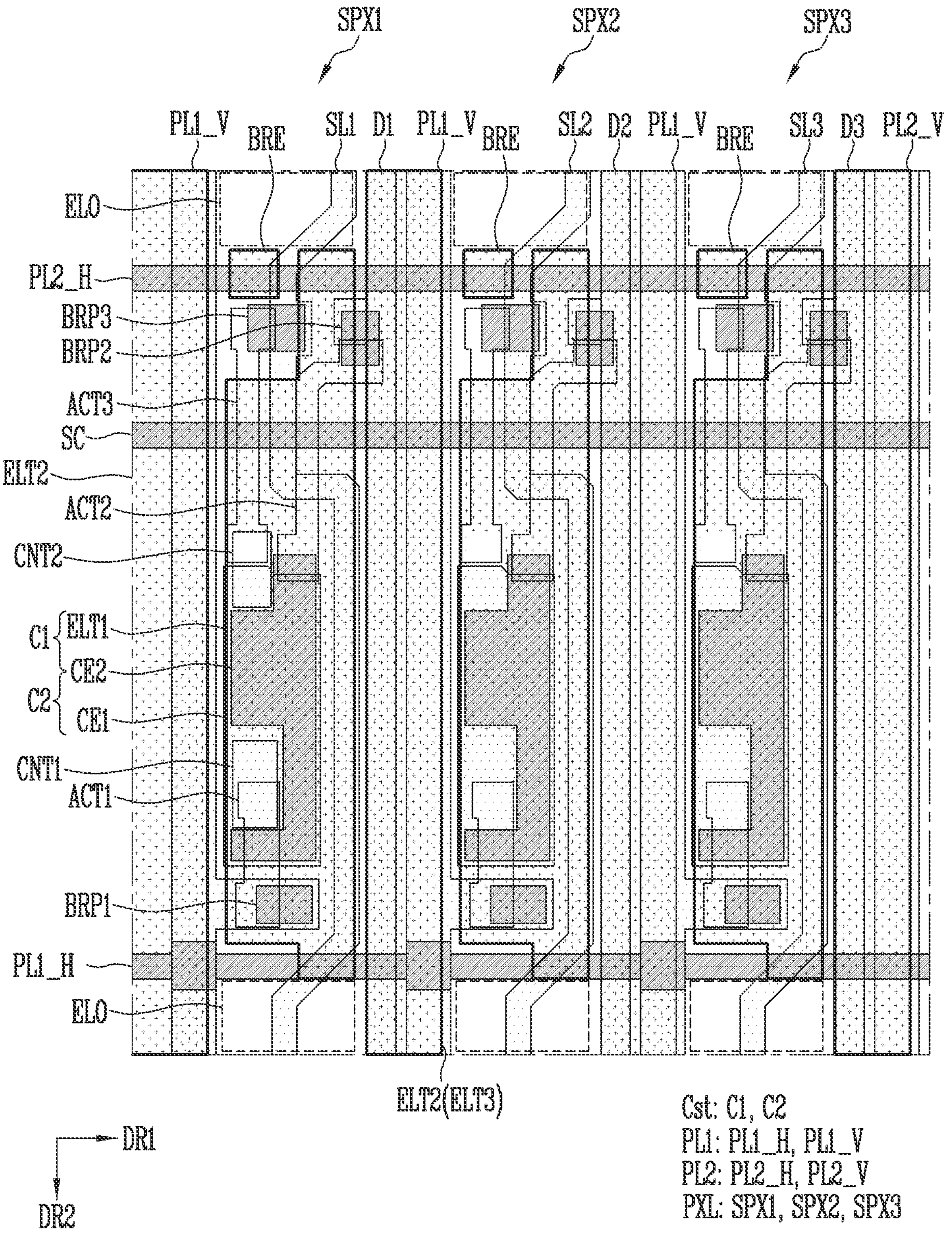

FIGS. 3 to 4 are layout diagrams each illustrating an embodiment of the pixel included in the display device of FIG. 1. In FIGS. 3 and 4, there is illustrated a layout of sub-pixels, focused on the pixel circuit PXC (or a pixel circuit layer) of the sub-pixel SPX of FIGS. 2A to 2D.

Referring to FIGS. 1 to 4, the pixel PXL may include a first sub-pixel SPX1, a second sub-pixel SPX2, and a third sub-pixel SPX3. The first sub-pixel SPX1, the second sub-pixel SPX2, and the third sub-pixel SPX3 may have a substantially identical or similar pixel structure (or circuit structure). Therefore, common configuration of the first sub-pixel SPX1, the second sub-pixel SPX2, and the third sub-pixel SPX3 will be described based on the first sub-pixel SPX1, and redundant explanation thereof will be omitted.

A first vertical power line PL1_V, sensing lines SL1 to SL3, data lines D1 to D3, and a second vertical power line PL2_V may generally extend in the second direction, and may be arranged along the first direction DR1. The sensing lines SL1 to SL3 may have a partially curved shape, but the present disclosure is not limited thereto.

The first vertical power line PL1_V may be disposed on a left side of a first capacitor electrode CE1 of the first sub-pixel SPX1. The sensing lines SL1 to SL3 and the data lines D1 to D3 may be disposed on a right side of the first capacitor electrode CE1 of the corresponding sub-pixel. For example, each of the first sensing line SL1 and the first data line D1 may be disposed on the right side of the first capacitor electrode CE1 of the first sub-pixel SPX1. The second vertical power line PL2_V may be disposed on a right side of the third sub-pixel SPX3 (or the pixel PXL).

The first vertical power line PL1_V, the sensing lines SL1 to SL3, the data lines D1 to D3, the second vertical power line PL2_V, and the first capacitor electrode CE1 may include the same material, and may be disposed at the same layer through the same process.

A second horizontal power line PL2_H, a gate line SC, and a first horizontal power line PL1_H may extend in the first direction DR1, and may be arranged along the second direction DR2. The second horizontal power line PL2_H and the gate line SC may be disposed on an upper side of a second capacitor electrode CE2 of the first sub-pixel SPX1. The first horizontal power line PL1_H may be disposed on a lower side of the second capacitor electrode CE2. The gate line SC may correspond to the scan line Si and the sensing control line SSi that are illustrated in FIGS. 2A to 2D.

The second horizontal power line PL2_H, the gate line SC, the first horizontal power line PL1_H, the second capacitor electrode CE2, and first, second, and third bridge patterns BRP1, BRP2, and BRP3 (or connection patterns) may include the same material, and may be disposed on the same layer through the same process.

The second capacitor electrode CE2 and the first capacitor electrode CE1 may overlap each other to form the first capacitor C1. In a plan view, most portion of the second capacitor electrode CE2 may be covered with the first capacitor electrode CE1. The surface area of the second capacitor electrode CE2 may be less than that of the first capacitor electrode CE1. To increase or maximize the capacitance (or capacity) of the first capacitor C1, most portion of the first capacitor electrode CE1 other than portions thereof corresponding to a first contact hole CNT1 and a second contact hole CNT2 illustrated in FIG. 4 may overlap the second capacitor electrode CE2.

The second horizontal power line PL2_H may cross the second vertical power line PL2_V, and may be connected to the second vertical power line PL2_V through a contact hole (and a bridge pattern) in the crossing area. The second horizontal power line PL2_H and the second vertical power line PL2_V may form an overall mesh structure, and may form the second power line PL2 (refer to FIGS. 2A to 2D).

Likewise, the first horizontal power line PL1_H may cross the first vertical power line PL1_V, and may be connected to the first vertical power line PL1_V through a contact hole (and a bridge pattern) in the crossing area. The first horizontal power line PL1_H and the first vertical power line PL1_V may form an overall mesh structure, and may form the first power line PL1 (refer to FIG. 2C). The locations of the first horizontal power line PL1_H and the second horizontal power line PL2_H may be switched with each other.

A first semiconductor pattern ACT1 may be located on a lower side of the first and second capacitor electrodes CE1 and CE2, and may partially overlap the first and second capacitor electrodes CE1 and CE2. A central portion of the first semiconductor pattern ACT1 that overlaps the first and second capacitor electrodes CE1 and CE2 may form the channel of the first transistor T1 (refer to FIG. 2C). The second capacitor electrode CE2 may form the gate electrode of the first transistor T1. The first capacitor electrode CE1 may form the back gate electrode of the first transistor T1. A first portion (e.g., a lower portion) of the first semiconductor pattern ACT1 may be electrically connected to a protrusion of the first vertical power line PL1_V through the first bridge pattern BRP1 (and a contact hole). The first portion of the first semiconductor pattern ACT1 or the first bridge pattern BRP1 may be the first electrode of the first transistor T1. In an opening of the second capacitor electrode CE2 (i.e., an opening that exposes the first capacitor electrode CE1), a second portion (e.g., an upper portion) of the first semiconductor pattern ACT1 may be electrically connected to the first capacitor electrode CE1 through the first contact hole CNT1 (refer to FIG. 4) and a first alignment electrode ELT1 (refer to FIG. 4). The second portion of the first semiconductor pattern ACT1 or the first alignment electrode ELT1 may be the second electrode of the first transistor T1.

The second semiconductor pattern ACT2 may be disposed on an upper side of the second capacitor electrode CE2, and may partially overlap the gate line SC. A central portion of the second semiconductor pattern ACT2 that overlaps the gate line SC may form a channel of the second transistor T2. The gate line SC may form the gate electrode of the second transistor T2. A second portion of the second semiconductor pattern ACT2 may be electrically connected to the second capacitor electrode CE2. For example, the second capacitor electrode CE2 may contact the second portion of the second semiconductor pattern ACT2 through a contact hole. The second portion of the second semiconductor pattern ACT2 or the second capacitor electrode CE2 may be the second electrode of the second transistor T2. A first portion of the second semiconductor pattern ACT2 may be electrically connected to the first data line D1 through the second bridge pattern BRP2 (and a contact hole). The first portion of the first semiconductor pattern ACT1 or the first bridge pattern BRP1 may be the first electrode of the first transistor T1.

The third semiconductor pattern ACT3 may be disposed on an upper side of the first capacitor electrode CE1, and may partially overlap the gate line SC. A central portion of the third semiconductor pattern ACT3 that overlaps the gate line SC may form a channel of the third transistor T3. The gate line SC may form the gate electrode of the third transistor T3. A second portion of the third semiconductor pattern ACT3 may be electrically connected to the first capacitor electrode CE1 through the second contact hole CNT2 (refer to FIG. 4) and the first alignment electrode ELT1 (refer to FIG. 4). The second portion of the third semiconductor pattern ACT3 or the first alignment electrode ELT1 may be the second electrode of the third transistor T3. A first portion of the third semiconductor pattern ACT3 may be electrically connected to the first sensing line SL1 through the third bridge pattern BRP3 (and a contact hole). The first portion of the third semiconductor pattern ACT3 or the third bridge pattern BRP3 may be the first electrode of the third transistor T3.

The semiconductor patterns ACT1 to ACT3 may include the same material, and may be disposed at the same layer through the same process. The semiconductor patterns ACT1 to ACT3 may include polycrystalline silicon, amorphous silicon, an oxide semiconductor, or the like. The channel (or the channel area) of each of the semiconductor patterns ACT1 to ACT3 may be an undoped semiconductor pattern. The first and second portions (or the areas other than the channel) of each of the semiconductor patterns ACT1 to ACT3 may be a semiconductor pattern doped with impurities.

As illustrated in FIG. 4, the first alignment electrode ELT1 (or a first electrode, or a first reflective electrode), and a second alignment electrode ELT2 (or a second electrode, or a second reflective electrode) may extend in the second direction DR2, and may be arranged along the first direction DR1. For convenience of explanation, the second alignment electrode ELT2 that is located on a right side of the first sub-pixel SPX1 (or the corresponding sub-pixel) will be referred to as a third alignment electrode ELT3 (or a third electrode, or a third reflective electrode).

The second alignment electrode ELT2 may extend to sub-pixels adjacent to the first sub-pixel SPX1 in the second direction DR2. In other words, the second alignment electrode ELT2 may extend over a plurality of sub-pixels. The second alignment electrode ELT2 may overlap the first vertical power line PL1_V (and the second vertical power line PL2_V). The second alignment electrode ELT2 may be electrically connected to the first vertical power line PL1_V through a contact hole.

The first alignment electrode ELT1 may be located between the second alignment electrode ELT2 and the third alignment electrode ELT3, and may be located between the second horizontal power line PL2_H and the first horizontal power line PL1_H in the second direction DR2. The first alignment electrode ELT1 may be spaced from another first alignment electrode adjacent thereto in the second direction DR2 with an electrode opening ELO interposed therebetween. For example, the first alignment electrode ELT1 and a first alignment electrode adjacent thereto in the second direction DR2 may be formed as a single electrode, in other words, may be integrally formed with each other, and thereafter separated from each other by removing a portion the single electrode that corresponds to the electrode opening ELO. The first alignment electrode ELT1 may be disposed in the form of an island in each of the sub-pixels SPX1 to SPX3.

The first alignment electrode ELT1 may overlap the first capacitor electrode CE1 and the second capacitor electrode CE2, and may cover the first capacitor electrode CE1 and the second capacitor electrode CE2 in a plan view. The first alignment electrode ELT1 may overlap the second capacitor electrode CE2 to form the second capacitor C2. The second capacitor C2 and the first capacitor C1 (refer to FIG. 3) may share the second capacitor electrode CE2. The first alignment electrode ELT1 may be brought into contact with or may be electrically connected with the first capacitor electrode CE1 through the first contact hole CNT1. Hence, the first capacitor C1 and the second capacitor C2 may be connected in parallel to each other.

The first alignment electrode ELT1 may overlap most of the circuit components of the first sub-pixel SPX1. For example, the first alignment electrode ELT1 may cover or shield the first transistor T1, the second transistor T2, and the third transistor T3 (or the channel or the gate electrode of the third transistor T3). In this case, the component that is disposed on the first alignment electrode ELT1 may be prevented from influencing (or being coupled to) the circuit components of the first sub-pixel SPX1 (e.g., the second capacitor electrode CE2 or the gate electrode of the first transistor T1).

A bridge electrode BRE may be spaced from or separated from the first alignment electrode ELT1 and the second alignment electrode ELT2, and may overlap the second horizontal power line PL2_H. The bridge electrode BRE may be brought into contact with or may be electrically connected to the second horizontal power line PL2_H through a contact hole. For reference, the bridge electrode BRE and the first alignment electrode ELT1 may be formed as a single electrode, in other words, may be integrally formed with each other, and thereafter, the bridge electrode BRE may be separated from the first alignment electrode ELT1 by removing a portion of the single electrode that corresponds to the electrode opening ELO. The bridge electrode BRE may be disposed in the form of an island in each of the sub-pixels SPX1 to SPX3.

The first alignment electrode ELT1, the second alignment electrode ELT2, and the bridge electrode BRE may include the same material, and may be disposed at the same layer through the same process.

As described above, the first capacitor electrode CE1 and the second capacitor electrode CE2 may form the first capacitor C1. The second capacitor electrode CE2 and the first alignment electrode ELT1 may form the second capacitor C2. Therefore, the capacitance (or the capacity) of the storage capacitor Cst (e.g., C1 and C2) can be sufficiently increased. Furthermore, the first alignment electrode ELT1 that forms one electrode of the second capacitor C2 may cover or shield the second capacitor electrode CE2 (or the gate electrode of the first transistor T1). Therefore, a data signal may be more accurately charged to or maintained in the storage capacitor Cst (or the gate electrode of the first transistor T1), and the sub-pixel may more reliably emit light at a target luminance, so that the display quality can be enhanced.

Figure 5:
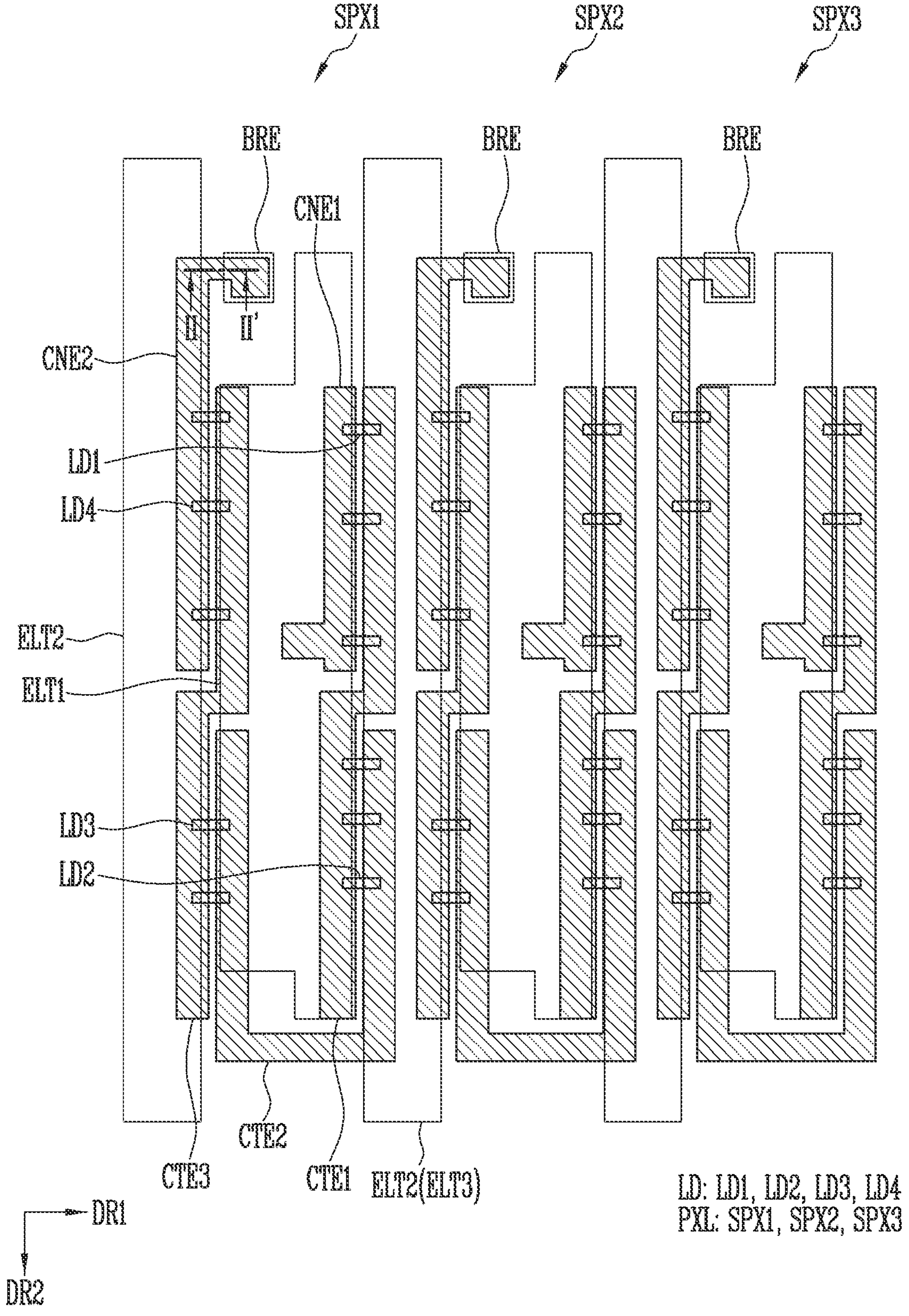
FIG. 5 is a plan view illustrating a pixel included in the display device of FIG. 1 in accordance with one or more embodiments.

FIG. 5 is a plan view illustrating a pixel PXL included in the display device of FIG. 1 in accordance with one or more embodiments. FIG. 5 simply illustrates the pixel PXL, based on the light source unit LSU (refer to FIG. 2D) of the sub-pixel SPX of FIG. 2D. Because the first sub-pixel SPX1, the second sub-pixel SPX2, and the third sub-pixel SPX3 of the pixel PXL may be substantially identical or similar to each other, the first sub-pixel SPX1 will be described as a representative example, and redundant explanation thereof will be omitted.

Referring to FIGS. 1 to 5, the alignment electrodes ELT1 to ELT3 may be used as alignment electrodes for aligning the light emitting elements LD. During a process of fabricating the display device, the light emitting elements LD supplied to an emission area EMA may be aligned in a desired direction and/or at positions by electric fields formed between the alignment electrodes ELT1 to ELT3. For example, the light emitting elements LD may be arranged between the first alignment electrode ELT1 and the second alignment electrode ELT2 (or the third alignment electrode ELT3) such that the longitudinal direction of the light emitting elements LD is substantially parallel to the first direction DR1.

The first electrode CNE1 may overlap the first end of the first light emitting element LD1 and the first alignment electrode ELT1. The first electrode CNE1 may electrically connect the first end of the first light emitting element LD1 to the first alignment electrode ELT1. As described with reference to FIG. 4, the first alignment electrode ELT1 may form one electrode of the storage capacitor Cst and may be connected to the second electrode of the first transistor T1, so that the first electrode CNE1 can be electrically connected to the second electrode of the first transistor T1.

The first intermediate electrode CTE1 may overlap the second end of the first light emitting element LD1 and the second alignment electrode ELT2 (or the third electrode ELT3). Furthermore, the first intermediate electrode CTE1 may overlap the first end of the second light emitting element LD2 and the first alignment electrode ELT1. To this end, a portion of the first intermediate electrode CTE1 may have a curved shape. The first intermediate electrode CTE1 may physically and/or electrically connect the second end of the first light emitting element LD1 to the first end of the second light emitting element LD2.

The second intermediate electrode CTE2 may overlap the second end of the second light emitting element LD2 and the second alignment electrode ELT2 (or the third electrode ELT3). Furthermore, the second intermediate electrode CTE2 may overlap the first end of the third light emitting element LD3 and the first alignment electrode ELT1. The second intermediate electrode CTE2 may have a shape detouring around the first intermediate electrode CTE1. The second intermediate electrode CTE2 may physically and/or electrically connect the second end of the second light emitting element LD2 to the first end of the third light emitting element LD3.

The third intermediate electrode CTE3 may overlap the second end of the third light emitting element LD3 and the second alignment electrode ELT2. Furthermore, the third intermediate electrode CTE3 may be disposed to overlap the first end of the fourth light emitting element LD4 and the first alignment electrode ELT1. To this end, a portion of the third intermediate electrode CTE3 may have a curved shape. The third intermediate electrode CTE3 may physically and/or electrically connect the second end of the third light emitting element LD3 to the first end of the fourth light emitting element LD4.

The second electrode CNE2 may overlap the second end of the fourth light emitting element LD4 and the second alignment electrode ELT2. Furthermore, the second electrode CNE2 may overlap the bridge electrode BRE and contact the bridge electrode BRE. The second electrode CNE2 may electrically connect the second end of the fourth light emitting element LD4 to the bridge electrode BRE. As described with reference to FIG. 4, the bridge electrode BRE may be connected to the second horizontal power line PL2_H, so that the second electrode CNE2 may be electrically connected to the second horizontal power line PL2_H (or the second power line PL2).

As described above, the light emitting elements LD1 to LD4 may be connected in series between the first electrode CNE1 and the second electrode CNE2. The shape of each of the alignment electrodes ELT1 to ELT3, the first and second electrodes CNE1 and CNE2, and the intermediate electrodes CTE1 to CTE3 may be changed in various ways depending on the arrangement and/or series/parallel structure of the light emitting elements LD. In addition, at least one of the intermediate electrode CTE1, the intermediate electrode CTE2, or the intermediate electrode CTE3 may be omitted.

Figure 6:
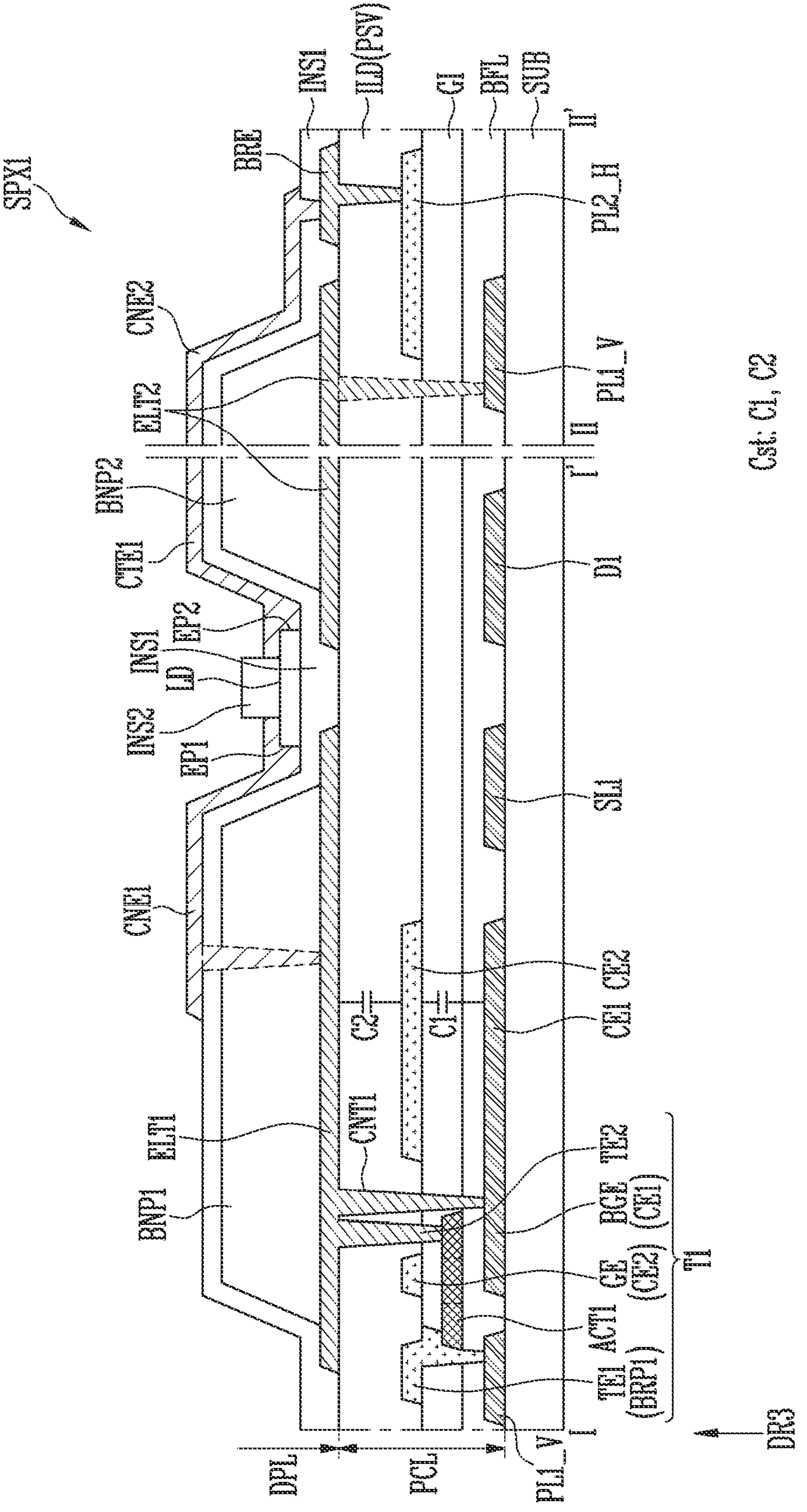
FIG. 6 is a sectional view illustrating a first sub-pixel taken along the lines I-I' and II-II' of FIGS. 3 to 5 in accordance with one or more embodiments.

FIG. 6 is a sectional illustrating an embodiment of the first sub-pixel taken along the lines I-I' and II-II' of FIGS. 3 to 5.

Although FIG. 6 simply illustrates the first sub-pixel SPX1 (or the sub-pixel), for example, illustrating that each electrode is formed of a single electrode and each insulating layer is formed of a single insulating layer, the present disclosure is not limited thereto.

Referring to FIGS. 3 to 6, the first sub-pixel SPX1 may include a pixel circuit layer PCL and a display element layer DPL that are disposed on the substrate SUB.

For the convenience sake, the pixel circuit layer PCL will be first described, and then the display element layer DPL will be described.

The pixel circuit layer PCL may include a first conductive layer (or a first metal layer), the first transistor T1, and a second conductive layer (or a second metal layer).

The first conductive layer may be disposed on the substrate SUB, and include the first vertical power line PL1_V, the back gate electrode BGE, the first capacitor electrode CE1, the first sensing line SL1, and the first data line D1. The back gate electrode BGE may be a portion (or an area) of the first capacitor electrode CE1 that overlaps the first semiconductor pattern ACT1 in a thickness direction of the substrate SUB (e.g., a third direction DR3).

The first conductive layer may include a conductive material. For example, the conductive material may include copper (Cu), molybdenum (Mo), tungsten (W), aluminum-neodymium (AlNd), titanium (Ti), aluminum (Al), silver (Ag), and/or an alloy thereof. The first conductive layer may have a single-layer structure, a double-layer structure, or a multi-layer structure. For example, to reduce line resistance, the first conductive layer may have a double-layer or multi-layer structure formed of molybdenum (Mo), titanium (Ti), copper (Cu), aluminum (Al), and/or silver (Ag), which are low-resistance materials.

The buffer layer BFL may be provided and/or formed on the substrate SUB and the first conductive layer, and prevent impurities from diffusing into the first transistor T1. The buffer layer BFL may be an inorganic insulating layer including an inorganic material. For example, the inorganic material may include at least one of silicon nitride ($SiN_x$), silicon oxide ($SiO_x$), silicon oxynitride ($SiO_xN_y$), or a metal oxide such as aluminum oxide ($AlO_x$). Although the buffer layer BFL may be provided in a single-layer structure, the buffer layer BFL may be provided in a multi-layer structure having at least two or more layers. In the case where the buffer layer BFL has a multi-layer structure, the respective layers may be formed of the same material or different materials. The buffer layer BFL may be omitted depending on the material of the substrate SUB or processing conditions.

The first semiconductor pattern ACT1 of the first transistor T1 may be provided and/or formed on the buffer layer BFL. The first semiconductor pattern ACT1 may include a first contact area, a second contact area, and a channel area formed between the first and second contact areas. The first contact area may contact the first transistor electrode TE1 (or the first bridge pattern BRP1). The second contact area may contact the second transistor electrode TE2 (or the first alignment electrode ELT1). The channel area may overlap the gate electrode GE of the first transistor T1 in the third direction DR3. The first semiconductor pattern ACT1 may be a semiconductor pattern made of amorphous silicon, poly silicon, low temperature poly silicon, an oxide semiconductor, an organic semiconductor, or the like. For example, the channel area may be a semiconductor pattern undoped with impurities and may be an intrinsic semiconductor. Each of the first contact area and the second contact area may be a semiconductor pattern doped with impurities.

The gate insulating layer GI may be disposed on the first semiconductor pattern ACT1 and the buffer layer BFL. The gate insulating layer GI may include an inorganic material. Various materials capable of providing insulating properties to the gate insulating layer GI may be used. For example, the gate insulating layer GI may be formed of an organic material. Although the gate insulating layer GI may be provided in a single-layer structure, the gate insulating layer GI may be provided in a multi-layer structure having at least two or more layers.

The second conductive layer may be disposed on the gate insulating layer GI, and may include the first transistor electrode TE1 (or the first bridge pattern BRP1), the gate electrode GE of the first transistor T1, the second capacitor electrode CE2, and the second horizontal power line PL2_H. The gate electrode GE may overlap the channel area of the first semiconductor pattern ACT1 in the third direction DR3. The second capacitor electrode CE2 may overlap the first capacitor electrode CE1 to form the first capacitor C1. The second conductive layer may include a conductive material. The second conductive layer may include the same material as that of the first conductive layer, or include one or more materials selected from among materials exemplified as the constituent material of the first conductive layer.

An interlayer insulating layer ILD (or a passivation layer PSV) may be disposed on the second conductive layer and gate insulating layer GI. The interlayer insulating layer ILD (or the passivation layer PSV) may include an organic material and/or an inorganic material. The organic material may include, for example, polyacrylate resin, epoxy resin, phenolic resin, polyamide resin, polyimide resin, unsaturated polyester resin, poly-phenylen ether resin, poly-phenylene sulfide resin, and/or benzocyclobutene resin. For example, the interlayer insulating layer ILD may be provided in a structure including an organic layer, an inorganic layer, or an organic layer disposed on an inorganic layer.

The display element layer DPL may be provided on the interlayer insulating layer ILD (or the passivation layer PSV).

The display element layer DPL may include an alignment electrode layer, first and second bank patterns BNP1 and BNP2 (or banks), the light emitting elements LD, the first and second electrodes CNE1 and CNE2, and at least the first intermediate electrode CTE1. Furthermore, the display element layer DPL may include first and second insulating layers INS1 and INS2.

The alignment electrode layer may be disposed on the interlayer insulating layer ILD, and may include the first alignment electrode ELT1, the second alignment electrode ELT2, and the bridge electrode BRE.

The first alignment electrode ELT1 may contact the first semiconductor pattern ACT1 of the first transistor T1 and the first capacitor electrode CE1 (and the back gate electrode BGE). As described above, the first alignment electrode ELT1 along with the second capacitor electrode CE2 may form the second capacitor C2. As illustrated in FIGS. 4 and 6, conductive components such as other signal lines or a power line, except the interlayer insulating layer ILD (or an insulating layer), may not be disposed between the first alignment electrode ELT1 and the second capacitor electrode CE2. The first alignment electrode ELT1 along with the first electrode CNE1 may form an anode electrode of the first sub-pixel SPX1.

The second alignment electrode ELT2 may be brought into contact with or may be electrically connected to the vertical power line PL1_V through a contact hole, but the present disclosure is not limited thereto.

The bridge electrode BRE may be brought into contact with or may be electrically connected to the second horizontal power line PL2_H through a contact hole. The bridge electrode BRE may electrically connect the second electrode CNE2 to the second horizontal power line PL2_H.

During a process of fabricating the display device, the first alignment electrode ELT1 (or the first alignment electrode ELT1 that is before being separated from the bridge electrode BRE) and the second alignment electrode ELT2 may be supplied with certain alignment signals (or alignment voltages) and used as alignment lines for aligning the light emitting elements LD. For example, the first alignment electrode ELT1 may be supplied with a first alignment signal (or a first alignment voltage) from a component (e.g., the second horizontal power line PL2_H) of the pixel circuit layer PCL and thus used as a first alignment line. The second alignment electrode ELT2 may be supplied with a second alignment signal (or a second alignment voltage) from another component (e.g., the first vertical power line PL1_V) of the pixel circuit layer PCL and thus used as a second alignment line.

The alignment electrode layer may be made of material having a certain reflectivity to enable light emitted from the light emitting element LD to travel in an image display direction of the display device (e.g., the third direction DR3). The alignment electrode layer may be formed of a conductive material having a certain reflectivity. The conductive material may include an opaque metal that is suitable for reflecting, in the image display direction of the display device, light emitted from the light emitting element LD. For example, the opaque metal may include metal such as silver (Ag), magnesium (Mg), aluminum (Al), platinum (Pt), palladium (Pd), gold (Au), nickel (Ni), neodymium (Nd), iridium (Ir), chrome (Cr), titanium (Ti), and/or an alloy thereof. In one or more embodiments, the alignment electrode layer may include a transparent conductive material. The transparent conductive material may include transparent conductive oxides such as indium tin oxide (ITO), indium zinc oxide (IZO), zinc oxide ($ZnO_x$), indium gallium zinc oxide (IGZO), and indium tin zinc oxide (ITZO), and/or a conductive polymer such as poly(3,4-ethylenedioxythiophene) (PEDOT). In the case in which the alignment electrode layer includes a transparent conductive material, a separate conductive layer formed of an opaque metal for reflecting light emitted from the light emitting element LD in the image display direction of the display device may be added. However, the material of the alignment electrode layer is not limited to the foregoing materials.

The alignment electrode layer may be provided and/or formed to have a single-layer structure, but the present disclosure is not limited thereto. In one or more embodiments, the alignment electrode layer may be provided and/or formed in a multi-layer structure formed by stacking at least two materials from among metals, alloys, conductive oxides, and/or conductive polymers. The alignment electrode layer may be formed of a multi-layer structure including at least two layers to reduce or minimize distortion resulting from a signal delay when a signal (or a voltage) is transmitted to the light emitting element LD. For example, the first alignment electrode ELT1 may be formed of a multi-layer structure formed by stacking layers in a sequence of indium tin oxide (ITO)/silver(Ag)/indium tin oxide (ITO).

The first and second bank patterns BNP1 and BNP2 may be provided and/or formed on the alignment electrode layer. For example, the first bank pattern BNP1 may be disposed on the first alignment electrode ELT1, and the second bank pattern BNP2 may be disposed on the second alignment electrode ELT2. The first and second bank patterns BNP1 and BNP2 may be support components to support the first and second electrodes CNE1 and CNE2 and the first intermediate electrode CTE1. The first and second bank patterns BNP1 and BNP2 may change the surface profiles (or the shapes) of the first and second electrodes CNE1 and CNE2 and the first intermediate electrode CTE1.

In one or more embodiments, the first and second bank patterns BNP1 and BNP2 (or the banks) may define an emission area EMA (refer to FIG. 5) of the first sub-pixel SPX1. The first and second bank patterns BNP1 and BNP2 (or the banks) may form a dam structure configured to prevent a solution including light emitting elements LD from being drawn into the adjacent pixels PXL at the step of supplying light emitting elements LD onto the first insulating layer INS1, or to control the amount of solution such that a constant amount of solution is supplied to each sub-pixel.

Each of the first and second bank patterns BNP1 and BNP2 may include an inorganic material or an organic material. In one or more embodiments, the first and second bank patterns BNP1 and BNP2 each may include a single organic layer and/or a single inorganic layer, but the present disclosure is not limited thereto. In one or more embodiments, the first and second bank patterns BNP1 and BNP2 each may be provided in the form of a multi-layer structure formed by stacking at least one organic layer and at least one inorganic layer. However, the material of the first and second bank patterns BNP1 and BNP2 is not limited to the foregoing embodiments. In one or more embodiments, the first and second bank patterns BNP1 and BNP2 may include a conductive material.

The first and second bank patterns BNP1 and BNP2 each may have a trapezoidal cross-section having a width that is reduced in an upward direction (e.g., in the third direction DR3), but the present disclosure is not limited thereto. In one or more embodiments, each of the first and second bank patterns BNP1 and BNP2 may include a curved surface having a cross-sectional shape such as a semi-elliptical shape or a semi-circular shape (or a hemispherical shape) that is reduced in width upward in the third direction DR3. The present disclosure is not limited thereto.

Although in the foregoing embodiment the first and second bank patterns BNP1 and BNP2 have been described as being disposed on the electrode layer, the present disclosure is not limited thereto. In one or more embodiments, the first and second bank patterns BNP1 and BNP2 may be disposed between the electrode layer and the interlayer insulating layer ILD (or the passivation layer PSV). In one or more embodiments, the first and second bank patterns BNP1 and BNP2 may be formed through the same process as that of the interlayer insulating layer ILD (or the passivation layer PSV). In this case, the first and second bank patterns BNP1 and BNP2 each may be one area of the interlayer insulating layer ILD (or the passivation layer PSV). In one or more embodiments, the first and second bank patterns BNP1 and BNP2 may be omitted.

The first insulating layer INS1 may be provided and/or formed on the first and second bank patterns BNP1 and BNP2 and the electrode layer (e.g., ELT1, ELT2). The first insulating layer INS1 may include an inorganic material. However, the present disclosure is not limited thereto. The first insulating layer INS1 may be formed of an organic insulating layer that is suitable for planarizing a support surface of the light emitting element LD.

The light emitting elements LD may be disposed on the first insulating layer INS1 between the first and second bank patterns BNP1 and BNP2. Furthermore, in a plan view, the light emitting element LD may be aligned between the first alignment electrode ELT1 (or the first bank pattern BNP1)

and the second alignment electrode ELT2 (or the second bank pattern BNP2), in a plan view.

The light emitting element LD may be formed of a light emitting diode that is made of a material having an inorganic crystal structure and has a subminiature size, e.g., ranging from the nanometer scale to the micrometer scale. For example, the light emitting element LD may include a first semiconductor layer, a second semiconductor layer, an active layer, and an insulating layer. The first semiconductor layer may include a semiconductor layer having a certain type. The second semiconductor layer may include a semiconductor layer having a type different from that of the first semiconductor layer. For example, the first semiconductor may include an N-type semiconductor layer, and the second semiconductor layer may include a P-type semiconductor layer. The first semiconductor layer and the second semiconductor layer each may include at least one semiconductor material selected from among InAlGaN, GaN, AlGaN, InGaN, AlN, and InN. The active layer may be located between the first semiconductor layer and the second semiconductor layer, and may have a single or multi-quantum well structure. In the case where an electric field having a certain voltage or more is applied between the opposite ends of the light emitting element LD, light may be emitted by coupling of electron-hole pairs in the active layer.

The number of light emitting elements LD provided to the first sub-pixel SPX1 may be at least two to several tens. In one or more embodiments, the number of light emitting elements LD provided in the first sub-pixel SPX1 may be changed in various ways.

The light emitting element LD may emit any one light of color light and/or white light. In one or more embodiments, the light emitting element LD may emit blue light of a short-wavelength band, but the present disclosure is not limited thereto.

The second insulating layer INS2 (or a second insulating pattern) may be provided and/or formed on the light emitting element LD. The second insulating layer INS2 may be provided and/or formed on the light emitting element LD and partially cover the outer surface (e.g., the outer peripheral or circumferential surface) of each of the light emitting element LD. The second insulating layer INS2 may prevent the active layer of the light emitting element LD from contacting an external conductive material. The second insulating layer INS2 may cover only a portion of the outer surface (e.g., the outer peripheral or circumferential surface) of the light emitting element LD so that the opposite ends of the light emitting element LD can be exposed to the outside.

The second insulating layer INS2 may have a single-layer or multi-layer structure, and include at least one inorganic material and/or organic material. After the alignment of the light emitting elements LD has been completed, the second insulating layer INS2 is formed on the light emitting elements LD so that the light emitting elements LD may be prevented from being removed from the aligned position.

The first contact electrode CNE1 may be provided on the first bank pattern BNP1 and the first alignment electrode ELT1, and may be connected with the first alignment electrode ELT1 through a contact hole penetrating the first bank pattern BNP1. Furthermore, the first electrode CNE1 may be provided/or formed on a first end EP1 of the first light emitting element LD1, and may be connected to the first end EP1 of the light emitting element LD.

In one or more embodiments, in the case where a capping layer is disposed on the first alignment electrode ELT1, the first electrode CNE1 may be disposed on the capping layer and may be connected to the first alignment electrode ELT1 through the capping layer. The capping layer may protect the first alignment electrode ELT1 from a defect or the like, which may occur during a process of fabricating the display device, and increase adhesive force between the first alignment electrode ELT1 and the pixel circuit layer PCL disposed therebelow. The capping layer may include a transparent conductive material (or substance) such as indium zinc oxide (IZO).

The first intermediate electrode CTE1 may be provided on the second bank pattern BNP2 and the second alignment electrode ELT2. Furthermore, the first intermediate electrode CTE1 may be provided and/or formed on a second end EP2 of the light emitting element LD and connected to the second end EP2 of the light emitting element LD.

The second electrode CNE2 may be provided on the second bank pattern BNP2 and the second alignment electrode ELT2. Furthermore, the second electrode CNE2 may overlap the bridge electrode BRE, and may be connected to the bridge electrode BRE through a contact hole penetrating the first insulating layer INS1. As described above with reference to FIG. 5, the second electrode CNE2 may be electrically connected to the first intermediate electrode CTE1 through the light emitting element LD. Therefore, the second end EP2 of the light emitting element LD may be electrically connected to the bridge electrode BRE by the first intermediate electrode CTE1 and the second electrode CNE2. In one or more embodiments, in the case where the first intermediate electrode CTE1 is omitted (e.g., in the case of the sub-pixel SPX of FIG. 2B), the second end EP2 of the light emitting element LD may be electrically connected to the bridge electrode BRE through the second electrode CNE2.

To allow light emitted from the light emitting element LD to travel in the image display direction of the display device without light loss, the first and second electrodes CNE1 and CNE2 and the first intermediate electrode CTE1 may be formed of various transparent conductive materials. The material of the first and second electrodes CNE1 and CNE2 and the first intermediate electrode CTE1 is not limited to the foregoing materials. In one or more embodiments, the first and second electrodes CNE1 and CNE2 and the first intermediate electrode CTE1 may also be formed of various opaque conductive materials (or substances). The first and second electrodes CNE1 and CNE2 and the first intermediate electrode CTE1 each may have a single-layer or multi-layer structure.

The shape of each of the first and second electrodes CNE1 and CNE2 and the first intermediate electrode CTE1 may not be limited to a specific shape, and may be changed in various ways within a range capable of being reliably electrically connected with the light emitting element LD. Furthermore, the shape of each of the first and second electrodes CNE1 and CNE2 and the first intermediate electrode CTE1 may be changed in various ways, taking into account a connection relationship with electrodes disposed therebelow.

The first and second electrodes CNE1 and CNE2 and the first intermediate electrode CTE1 may be spaced from each other. For example, the first and second electrodes CNE1 and CNE2 and the first intermediate electrode CTE1 may be spaced from each other with the second insulating layer INS2 interposed therebetween. The first and second electrodes CNE1 and CNE2 and the first intermediate electrode CTE1 may be formed on the same layer through the same process, but the present disclosure is not limited thereto. For example, at least two of the first and second electrodes CNE1 and CNE2 and the first intermediate electrode CTE1 may be provided on different layers and formed through different processes.

In one or more embodiments, a third insulating layer (or an overcoat layer) may be provided and/or formed on the first and second electrodes CNE1 and CNE2 and the first intermediate electrode CTE1. The third insulating layer may include an inorganic material or an organic material. For example, the third insulating layer may have a structure formed by alternately stacking at least one inorganic layer and at least one organic layer. The third insulating layer may cover the entirety of the display element layer DPL and prevent external water or moisture from being drawn into the display element layer DPL including the light emitting element LD. The third insulating layer may planarize an upper surface of the display element layer DPL.

In one or more embodiments, the display element layer DPL may selectively further include an optical layer. For example, the display element layer DPL may further include a color conversion layer including color conversion particles for converting the color of light emitted from the light emitting elements LD to a specific color of light. Furthermore, the display element layer DPL may further include a color filter configured to allow light of only a specific wavelength band to pass therethrough.

Figure 7A:
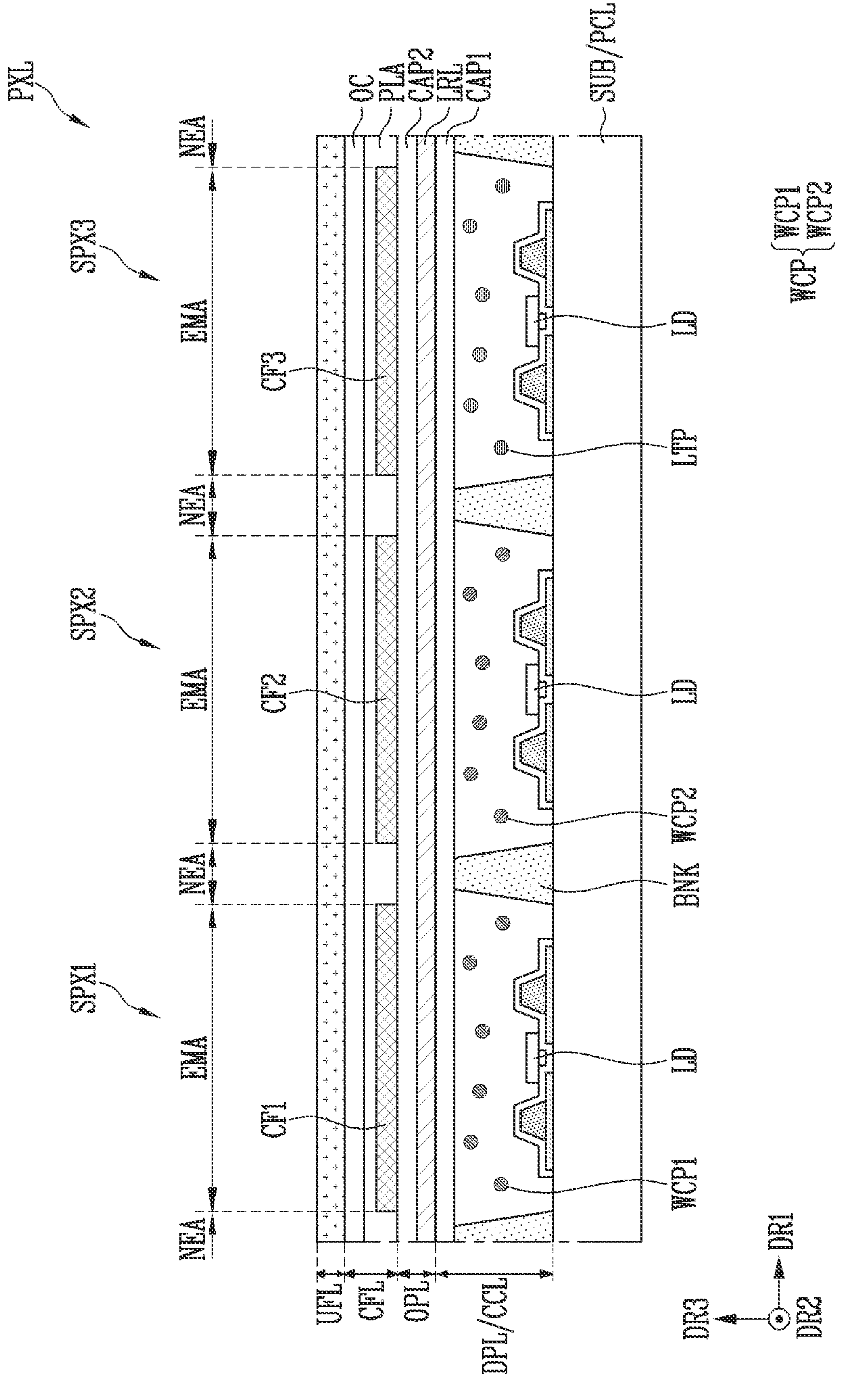
FIGS. 7A and 7B are sectional views illustrating a pixel included in the display device of FIG. 1 in accordance with one or more embodiments.
Figure 7B:
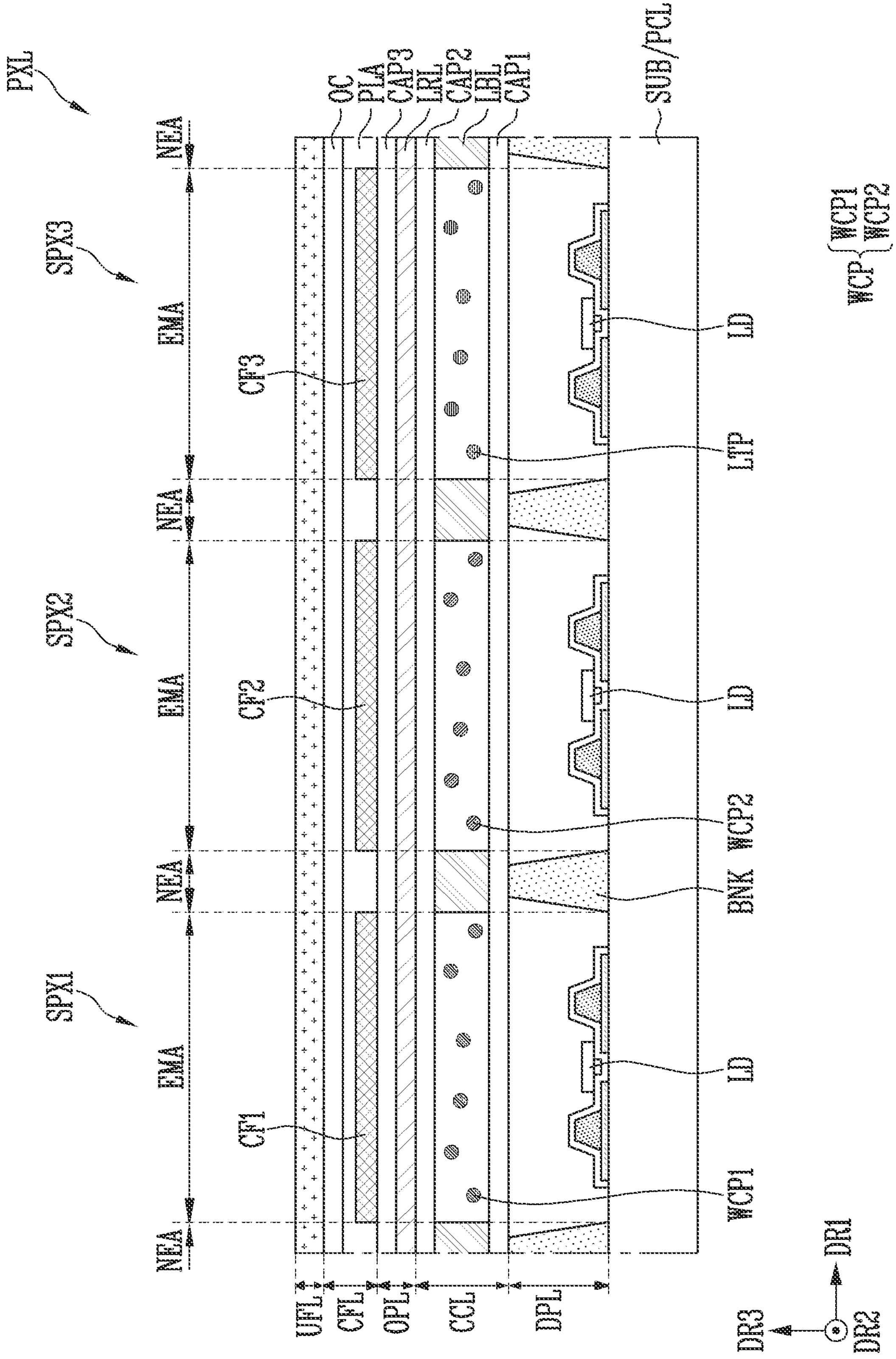

FIGS. 7A and 7B are sectional views illustrating a pixel included in the display device of FIG. 1 in accordance with one or more embodiments. For the sake of explanation, in FIGS. 7A and 7B, the individual components of the pixel circuit layer PCL and the display element layer DPL are schematically illustrated.

Referring to FIG. 7A, the light emitting elements LD disposed on the respective sub-pixels SPX1 to SPX3 may emit the same color of light. For example, the sub-pixels SPX1 to SPX3 may include light emitting elements LD configured to emit a third color of light, e.g., blue light. A color conversion layer CCL (or a color conversion component) and/or a color filter layer CFL may be provided on the sub-pixels SPX1 to SPX3 so that a full-color image can be displayed. However, the present disclosure is not limited thereto. The sub-pixels SPX1 to SPX3 may include light emitting elements LD configured to emit different colors of light.

The color conversion layer CCL may be disposed in the same layer as the display element layer DPL. For example, the color conversion layer CCL may be disposed between the banks BNK.

The bank BNK may be disposed in non-emission areas NEA of the sub-pixels SPX1 to SPX3. The bank BNK may be formed between the sub-pixels SPX1 to SPX3 to enclose each emission area EMA, whereby the emission area EMA of each of the sub-pixels SPX1 to SPX3 can be defined. The bank BNK may function as a dam structure that prevents a solution for forming a wavelength conversion pattern WCP and a light transmission pattern LTP in each emission area EMA from being drawn into the emission area EMA of an adjacent sub-pixel, or controls the amount of solution such that a certain amount of solution is supplied to each emission area EMA.

The bank BNK may include an organic material or an inorganic material. In one or more embodiments, the bank BNK may include a black matrix material (or a light blocking material) In this case, the bank BNK may prevent light generated from the sub-pixel (e.g., the second sub-pixel SPX2) from traveling to an adjacent sub-pixel (e.g., the first sub-pixel SPX1 or the third sub-pixel SPX3).

Openings through which the display element layer DPL is exposed may be formed in the bank BNK at respective positions corresponding to the emission areas EMA.

The color conversion layer CCL may include the wavelength conversion pattern (or a color conversion particle) WCP, the light transmission pattern LTP, and a first capping layer CAP1. The wavelength conversion pattern WCP may include a first wavelength conversion pattern WCP1, and a second wavelength conversion pattern WCP2.

The first wavelength conversion pattern WCP1 may be disposed to overlap the emission area EMA of the first sub-pixel SPX1. For example, the first wavelength conversion pattern WCP1 may be provided in the corresponding opening of the bank BNK. The second wavelength conversion pattern WCP2 may be disposed to overlap the emission area EMA of the second sub-pixel SPX2. The light transmission pattern LTP may be disposed to overlap the emission area EMA of the third sub-pixel SPX3.

In one or more embodiments, the first wavelength conversion pattern WCP1 may include first color conversion particles to convert the third color of light emitted from the light emitting elements LD to a first color of light. For example, in case that the light emitting element LD is a blue light emitting element configured to emit blue light and the first sub-pixel SPX1 is a red pixel, the first wavelength conversion pattern WCP1 may include first quantum dots to convert blue light emitted from the blue light emitting element to red light.

For example, the first wavelength conversion pattern WCP1 may include a plurality of first quantum dots dispersed in a suitable matrix material (e.g., a predetermined matrix material) such as base resin. The first quantum dots may absorb blue light, shift the wavelength thereof according to an energy transition, and thus emit red light. In case that the first sub-pixel SPX1 is a pixel configured to emit a different color of light, the first wavelength conversion pattern WCP1 may include first quantum dots corresponding to the color of the first sub-pixel SPX1.

In one or more embodiments, the second wavelength conversion pattern WCP2 may include second color conversion particles to convert the third color of light emitted from the light emitting elements LD to a second color of light. For example, in case that each light emitting element LD is a blue light emitting element configured to emit blue light and the second sub-pixel SPX2 is a green pixel, the second wavelength conversion pattern WCP2 may include second quantum dots to convert blue light emitted from the blue light emitting element to green light.

For example, the second wavelength conversion pattern WCP2 may include a plurality of second quantum dots dispersed in a suitable matrix material (e.g., a predetermined matrix material) such as base resin. The second quantum dots may absorb blue light, shift the wavelength thereof according to an energy transition, and thus emit green light.

The first quantum dots and the second quantum dots each may have the form of a nanoparticle, a nanotube, nanofiber, a planar nanoparticle, etc. having a spherical shape, a pyramid shape, a multi-arm shape, or a cubic shape, but the present disclosure is not limited thereto. The shape of each of the first quantum dots and the second quantum dots may be changed in various ways.

In one or more embodiments, as blue light having a relatively short wavelength in a visible ray area is incident on each of the first quantum dots and the second quantum dots, absorption coefficients of the first quantum dot and the second quantum dot may be increased. Eventually, the efficiency of light emitted from each of the first sub-pixel SPX1 and the second sub-pixel SPX2 may be enhanced, and satisfactory color reproducibility may be secured. Furthermore, the pixel PXL may be formed of light emitting elements (e.g., blue light emitting elements) configured to emit the same color of light, so that the production efficiency of the display device can be enhanced.

In one or more embodiments, the light transmission pattern LTP may be provided to efficiently use the third color of light emitted from the light emitting elements LD. For example, in case that each light emitting element LD is a blue light emitting element configured to emit blue light and the third sub-pixel SPX3 is a blue pixel, the light transmission pattern LTP may include at least one type of light scattering particles to efficiently use light emitted from the light emitting element LD.

For example, the light transmission pattern LTP may include a plurality of light scattering particles that are dispersed in a suitable matrix material (e.g., a predetermined matrix material) such as base resin. For example, the light transmission pattern LTP includes light scattering particles made of a material such as silica, but the constituent material of the light scattering particles is not limited thereto.

There is no need for the light scattering particles to be disposed in only the emission area EMA for the third sub-pixel SPX3. For example, the light scattering particles may also be selectively included in the first wavelength conversion pattern WCP1 and/or the second wavelength conversion pattern WCP2.

The first capping layer CAP1 may seal (or cover) the wavelength conversion pattern WCP and the light transmission pattern LTP. The first capping layer CAP1 may be disposed between a low refractive layer LRL and the display element layer DPL. The first capping layer CAP1 may be provided over the sub-pixels SPX1 to SPX3. The first capping layer CAP1 may prevent the color conversion layer CCL from being damaged or contaminated by permeation of external impurities such as water or air.

In one or more embodiments, the first capping layer CAP1 may have a single-layer or multi-layer structure including at least one insulating material selected from among silicon oxide ($SiO_x$), silicon nitride ($SiN_x$), silicon oxynitride ($SiO_xN_y$), aluminum oxide ($AlO_x$), and titanium dioxide ($TiO_x$), but the present disclosure is not limited thereto.

An optical layer OPL may include the low refractive layer LRL and the second capping layer CAP2. The optical layer OPL may be disposed on the color conversion layer CCL. The optical layer OPL may be disposed on the display element layer DPL.

The low refractive layer LRL may be disposed between the first capping layer CAP1 and the second capping layer CAP2. The low refractive layer LRL may be disposed between the color conversion layer CCL and the color filter layer CFL. The low refractive layer LRL may be provided over the sub-pixels SPX1 to SPX3.

The low refractive layer LRL may function to recycle light provided from the color conversion layer CCL by total reflection and thus enhance the light efficiency. Hence, the low refractive layer LRL may have a relatively low refractive index compared to that of the color conversion layer CCL.

In one or more embodiments, the low refractive layer LRL may include base resin and hollow particles dispersed in the base resin. The hollow particles may be hollow silica particles. Alternatively, the hollow particles may have a pore formed by porogen, but the present disclosure is not limited thereto. Furthermore, the low refractive layer LRL may include at least one of a zinc oxide (ZnO) particle, a titanium dioxide ($TiO_2$) particle, or a nano-silicate particle, but the present disclosure is not limited thereto.

The second capping layer CAP2 may be disposed on the low refractive layer LRL. The second capping layer CAP2 may be disposed between the color filter layer CFL and the low refractive layer LRL. The second capping layer CAP2 may be provided over the sub-pixels SPX1 to SPX3. The second capping layer CAP2 may prevent the low refractive layer LRL from being damaged or contaminated by permeation of external impurities such as water or air. The second capping layer CAP2 may include the same material as that of the first capping layer CAP1, or may include one or more materials selected from among materials exemplified as the constituent material of the first capping layer CPA1.

The color filter layer CFL may be disposed on the second capping layer CAP2. The color filter layer CFL may be provided over the sub-pixels SPX1 to SPX3. The color filter layer CFL may include color filters CF1 to CF3, a planarization layer PLA, and an overcoat layer OC.

In one or more embodiments, the color filters CF1 to CF3 may be disposed on the second capping layer CAP2. The color filters CF1 to CF3 may overlap the respective emission areas EMA of the sub-pixels SPX1 to SPX3 in a plan view.

In one or more embodiments, the first color filter CF1 may allow a first color of light to pass therethrough and prevent a second color of light and a third color of light from passing therethrough. For example, the first color filter CF1 may include colorant for the first color.

In one or more embodiments, the second color filter CF2 may allow the second color of light to pass therethrough and prevent the first color of light and the third color of light from passing therethrough. For example, the second color filter CF2 may include colorant for the second color.

In one or more embodiments, the third color filter CF3 may allow the third color of light to pass therethrough and prevent the first color of light and the second color of light from passing therethrough. For example, the third color filter CF3 may include colorant for the third color.

In one or more embodiments, the planarization layer PLA may be disposed on the color filters CF1 to CF3. The planarization layer PLA may cover the color filters CF1 to CF3. The planarization layer PLA may remove a step difference caused by the color filters CF1 to CF3. The planarization layer PLA may be provided over the sub-pixels SPX1 to SPX3.

In one or more embodiments, the planarization layer PLA may include an organic material, but the present disclosure is not limited thereto. For example, the planarization layer PLA may include an inorganic material.

The overcoat layer OC may be disposed on the planarization layer PLA. The overcoat layer OC may be disposed between an upper film layer UFL and the planarization layer PLA. The overcoat layer OC may be provided over the sub-pixels SPX1 to SPX3. The overcoat layer OC may cover a lower component including the color filter layer CFL. The overcoat layer OC may prevent water or air from permeating the lower component. Furthermore, the overcoat layer OC may protect the lower component from a foreign material such as dust.

The overcoat layer OC may include an organic material or an inorganic material. For example, the overcoat layer OC may include one or more materials selected from among materials exemplified as the constituent material of the planarization layer PLA.

The upper film layer UFL may be disposed on the color filter layer CFL. The upper film layer UFL may be disposed in a peripheral portion of the display device to reduce external influence on the display device. The upper film layer UFL may be provided over the sub-pixels SPX1 to SPX3.

In one or more embodiments, the upper film layer UFL may include an anti-reflective (AR) coating layer. The AR coating layer may refer to a component formed by applying a material having an anti-reflective function to a surface of a specific component. Here, the material to be applied may have a low reflectivity. In one or more embodiments, the material used to form the AR coating layer may include any one of silicon oxide ($SiO_x$), aluminum oxide ($AlO_x$), and/or titanium oxide ($TiO_x$). However, the present disclosure is not limited thereto, and various known materials may be used.

Although in FIG. 7A there has been described that the color conversion layer CCL is disposed on the same layer as that of the display element layer DPL, the present disclosure is not limited thereto.

Referring to FIG. 7B, the color conversion layer CCL may be disposed on the display element layer DPL. For example, the first capping layer CAP1 may seal (or cover) the area in which the light emitting elements LD are disposed. The color conversion layer CCL may be disposed on the first capping layer CAP1.

In one or more embodiments, the color conversion layer CCL may further include a light blocking layer LBL (or a light blocking pattern). The light blocking layer LBL may be disposed on the display element layer DPL and the first capping layer CAP1. The light blocking layer LBL may be disposed between the first capping layer CAP1 and the second capping layer CAP2. The light blocking layer LBL may be disposed in boundaries between the sub-pixels SPX1 to SPX3 (e.g., in the non-emission area NEA) to enclose the first wavelength conversion pattern WCP1, the second wavelength conversion pattern WCP2, and the light transmission pattern LTP.

The light blocking layer LBL may define the emission area EMA and the non-emission area NEA. For example, the light block layer LBL may not overlap the emission area EMA, in a plan view. The light block layer LBL may overlap the non-emission area NEA, in a plan view. In an embodiment, areas in which the light blocking layer LBL is not disposed may be defined as the emission areas EMA of the sub-pixels SPX1 to SPX3.

In one or more embodiments, the light blocking layer LBL may be formed of an organic material including at least one of graphite, carbon block, black pigment, or black dye, or formed of metal including chrome (Cr). The material of the light block layer LBL is not limited so long as the material can prevent light transmission and absorb light.

The second capping layer CAP2 may seal (or cover) the first wavelength conversion pattern WCP1, the second wavelength conversion pattern WCP2, and the light transmission pattern LTP.

The low refractive layer LRL may be disposed between the second capping layer CAP2 and a third capping layer CAP3. The third capping layer CAP3 may include the same material as that of the first capping layer CPA1, or may include one or more materials selected from among materials exemplified as the constituent material of the first capping layer CPA1. The color filter layer CFL and the upper film layer UFL may be disposed on the first capping layer CPA1.

Figure 8:
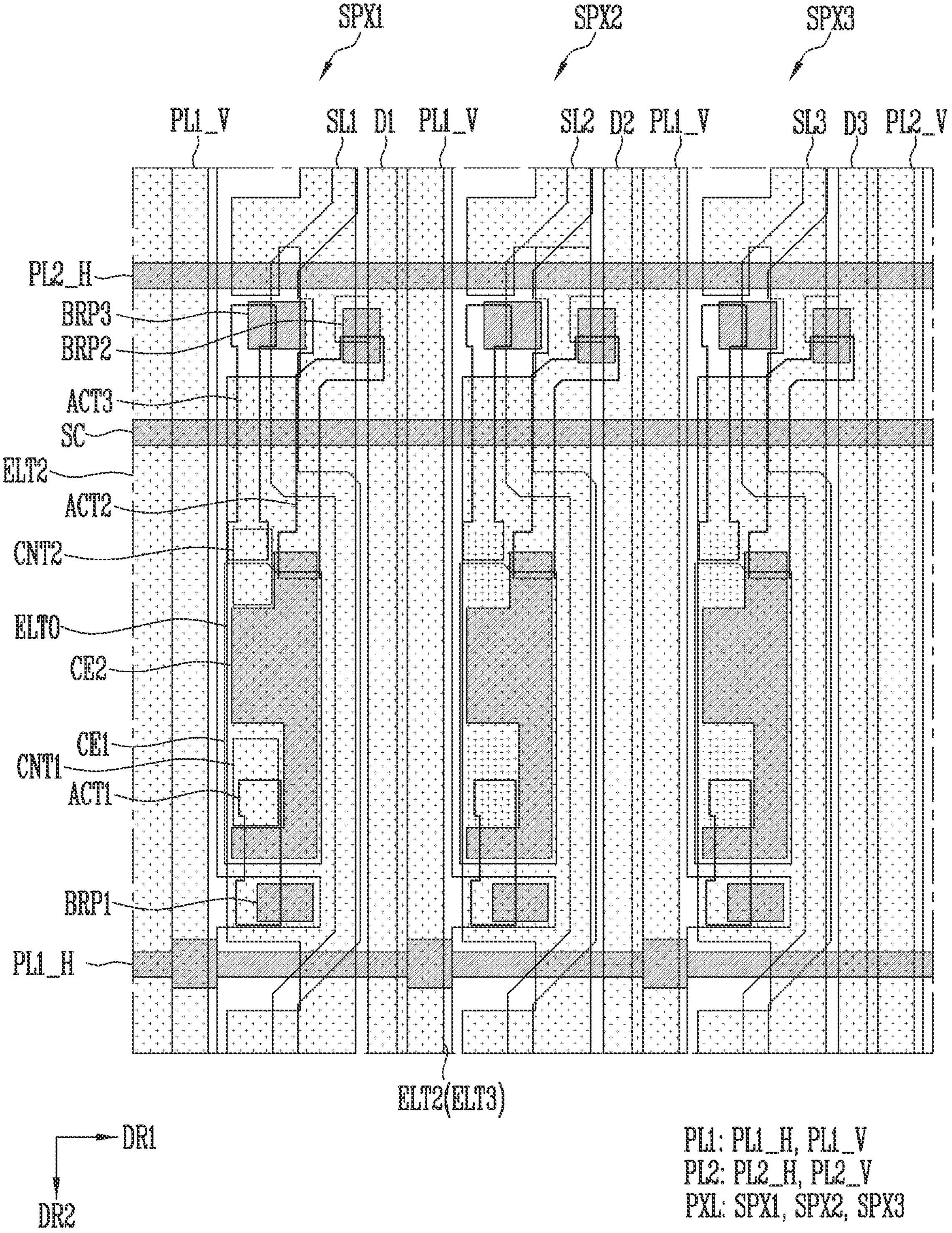
FIG. 8 is a layout diagram for describing a process of fabricating the display device of FIG. 1.

FIG. 8 is a layout diagram for described a process of fabricating the display device of FIG. 1. FIG. 8 may correspond to FIG. 4.

Referring to FIGS. 1, 3 to 6, and 8, an electrode layer may be formed on the interlayer insulating layer ILD. The electrode layer may include a reference alignment electrode ELT0 (or the first alignment line) and a second alignment electrode ELT2 (or the second alignment line). The reference alignment electrode ELT0 may be an electrode that is before the first alignment electrode ELT1 and the bridge electrode BRE of FIG. 4 are separated from each other. In a manner similar to the second alignment electrode ELT2, the reference alignment electrode ELT0 may extend to sub-pixels adjacent to the first sub-pixel SPX1 in the second direction DR2.

Thereafter, the first and second bank patterns BNP1 and BNP2 (or the banks) illustrated in FIG. 6 may be formed on the electrode layer. The first insulating layer INS1 may be formed on the electrode layer and the first and second bank patterns BNP1 and BNP2.

Subsequently, the light emitting elements LD may be supplied to the emission area EMA (refer to FIG. 5). For example, the light emitting elements LD may be prepared in a diffused form in a suitable solution (e.g., a predetermined solution, e.g., ink), and then supplied to the emission area EMA by an inkjet printing scheme, a slit coating scheme, or the like.

Concurrently with the supply of the light emitting elements LD or after the supply, alignment signals may be applied to the reference alignment electrode ELT0 and the second alignment electrode ELT2. For example, a ground voltage may be applied to the reference alignment electrode ELT0, and an AC voltage may be applied to the second alignment electrode ELT2, but the present disclosure is not limited thereto.

If the alignment signals are applied to the reference alignment electrode ELT0 and the second alignment electrode ELT2, an electric field may be formed between the reference alignment electrode ELT0 and the second alignment electrode ELT2, so that the light emitting elements LD may be self-aligned between the reference alignment electrode ELT0 and the second alignment electrode ELT2.

After the light emitting elements LD are aligned, a solvent may be removed by volatilization or other methods.

Thereafter, the second insulating layer INS2 illustrated in FIG. 6 may be formed.

Subsequently, the reference alignment electrode ELT0 may be divided into the first alignment electrode ELT1 and the bridge electrode BRE by removing a portion of the reference alignment electrode ELT0 that corresponds to an electrode opening ELO (refer to FIG. 4) of the reference alignment electrode ELT0. For reference, the first insulating layer INS1 of FIG. 6 may be removed by removing the reference alignment electrode ELT0 from the electrode opening ELO. Therefore, the alignment electrode and the first insulating layer INS1 may not be present nor disposed in the electrode opening ELO of FIG. 4 (i.e., the boundary areas between adjacent sub-pixels in the second direction DR2), or an opening corresponding to the electrode opening ELO may be formed in the first insulating layer INS1.

Thereafter, the first and second electrodes CNE1 and CNE2 (and the first intermediate electrode CTE1) illustrated in FIG. 6 may be formed. In one or more embodiments, the color conversion layer CCL, the color filter layer CFL, and the like, illustrated in FIGS. 7A and 7B, may be successively formed.

As described above, the first alignment electrode ELT1 (or the reference alignment electrode ELT0) may be used as electrodes for alignments of the light emitting elements LD during a process of fabricating the display device. After the light emitting elements LD are aligned, the first alignment electrode ELT1 may be separated from the bridge electrode BRE and function as one electrode of the storage capacitor Cst.

Figure 9:
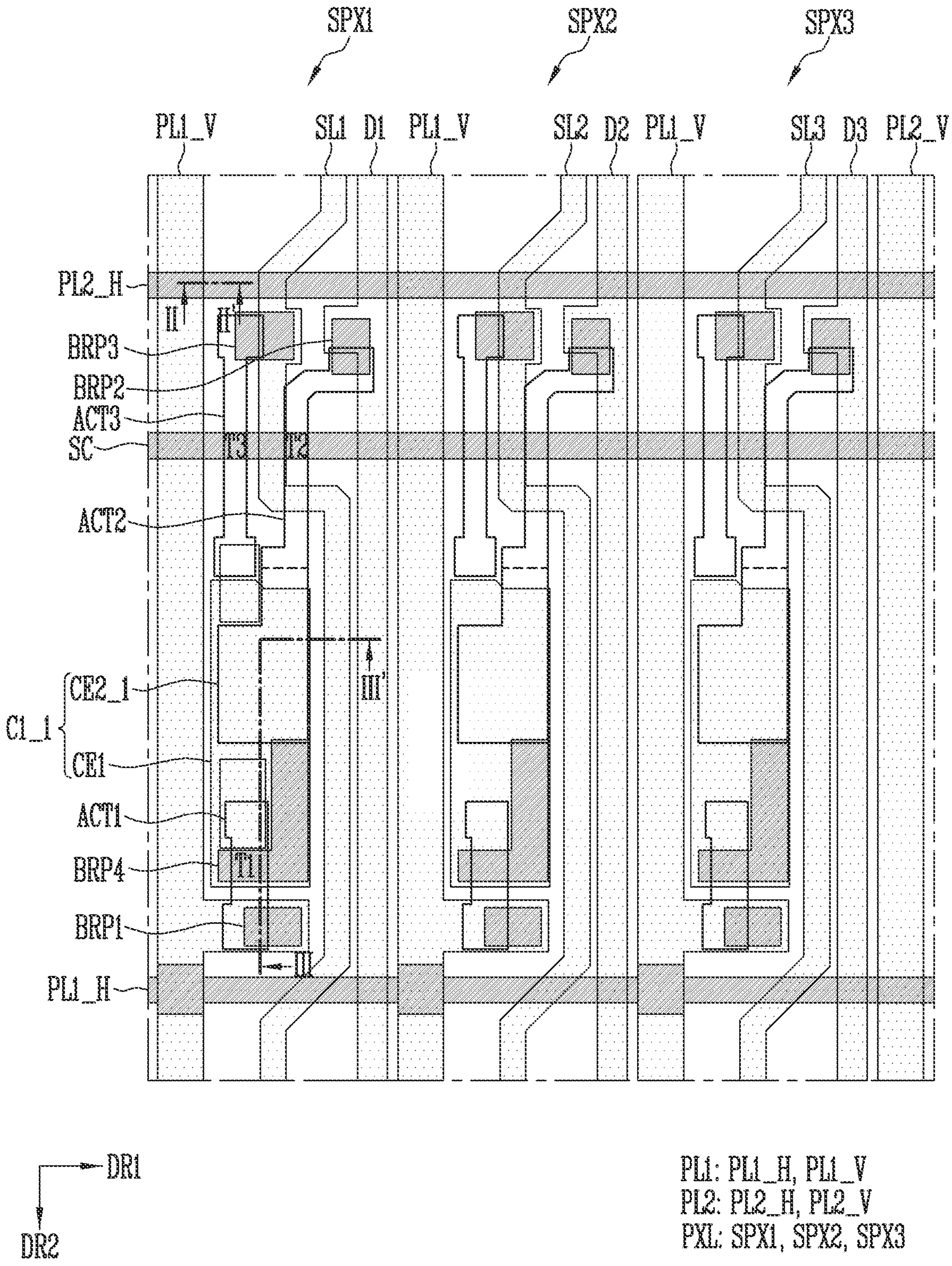
FIG. 9 is a layout diagram illustrating a pixel included in the display device of FIG. 1 in accordance with one or more embodiments.
Figure 10:
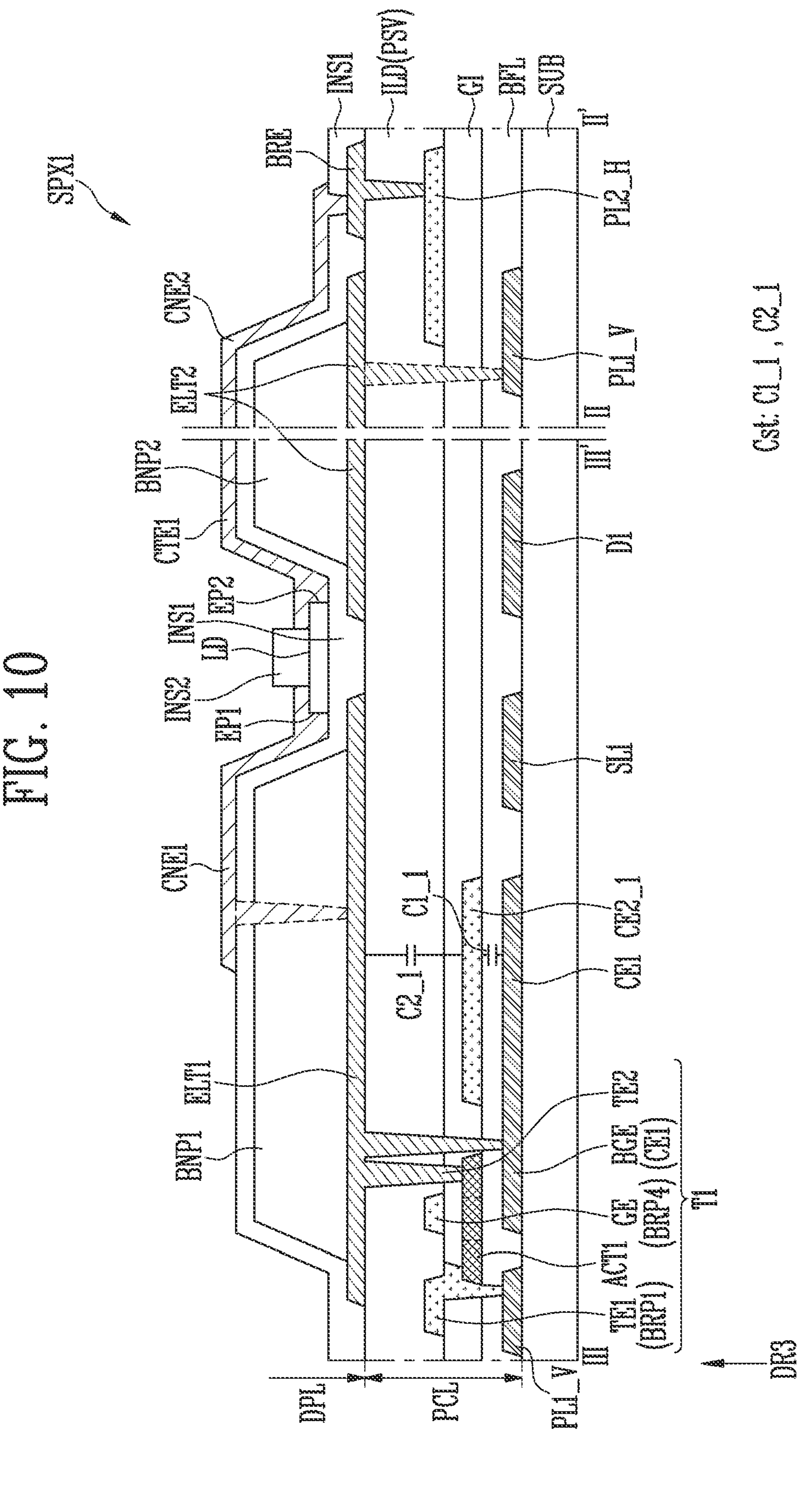
FIG. 10 is a sectional view illustrating a first sub-pixel taken along the lines III-III' and II-II' of FIG. 9 in accordance with one or more embodiments.

FIG. 9 is a layout diagram illustrating a pixel included in the display device of FIG. 1 in accordance with one or more embodiments. In FIG. 9, there is illustrated a layout of sub-pixels, focused on the pixel circuit PXC (or the pixel circuit layer) of the sub-pixel SPX of FIGS. 2A to 2D. FIG. 9 may correspond to FIG. 3. FIG. 10 is a sectional view illustrating the first sub-pixel taken along the lines III-III' and II-II' of FIG. 9 in accordance with one or more embodiments. FIG. 10 may correspond to FIG. 6.

Referring to FIGS. 1, 3 to 6, and 9 and 10, the pixel PXL of FIGS. 9 and 10 other than a second capacitor electrode CE2_1 and a fourth bridge pattern BRP4 may be substantially identical or similar to the pixel PXL of FIGS. 3 to 6. Therefore, repetitive explanation thereof will be omitted.

The second capacitor electrode CE2_1 may be included in the same layer as the first semiconductor pattern ACT1. As illustrated in FIG. 9, the second capacitor electrode CE2_1 may be integrally formed with the second semiconductor pattern ACT2. For example, the second capacitor electrode CE2_1 may be a partial area of the second semiconductor pattern ACT2 doped with impurities. However, the present disclosure is not limited thereto. For example, the second capacitor electrode CE2_1 may be a separate semiconductor pattern separated from the second semiconductor pattern ACT2.

The second capacitor electrode CE2_1 may overlap the first capacitor electrode CE1 to form a first capacitor C1_1. In a plan view, most portion of the second capacitor electrode CE2_1 may be covered with the first capacitor electrode CE1 in the third direction DR3. The surface area of the second capacitor electrode CE2_1 may be less than that of the first capacitor electrode CE1. To increase or maximize the capacitance (or the capacity) of the first capacitor C1, the second capacitor electrode CE2_1 may overlap most area of the first capacitor electrode CE1, except not only an area corresponding to the first contact hole CNT1 and the second contact hole CNT2 illustrated in FIG. 4 but also an area corresponding the fourth bridge pattern BRP4 that forms the gate electrode of the first transistor T1.

The pixel PXL of FIGS. 9 and 10 may include all of the components (i.e., the first and second alignment electrodes ELT1 and ELT2, the bridge electrode BRE, and the like) of the light source unit LSU (refer to FIG. 2D) illustrated in FIG. 5.

In this case, as illustrated in FIG. 10, the first alignment electrode ELT1 may overlap the second capacitor electrode CE2_1 to form a second capacitor C2_1. The second capacitor C2_1 and the first capacitor C1_1 may share the second capacitor electrode CE2_1. Because the first alignment electrode ELT1 is brought into contact with or is electrically connected to the first capacitor electrode CE1 through the first contact hole CNT1, the first capacitor C1_1 and the second capacitor C2_1 may be connected in parallel to each other.

The fourth bridge pattern BRP4 may be included in the same layer as the gate electrode of the first transistor T1 and the other bridge patterns BRP1 to BRP3. In other words, the fourth bridge pattern BRP4 may be included in the second conductive layer described with reference to FIG. 6. One end (e.g., an upper end) of the fourth bridge pattern BRP4 may overlap the second capacitor electrode CE2_1, and may be brought into contact with or may be connected to the second capacitor electrode CE2_1 through a contact hole. A remaining end (e.g., a lower end) of the fourth bridge pattern BRP4 may overlap the first semiconductor pattern ACT1 to form the gate electrode of the first transistor T1.

Capacitors may be formed between the fourth bridge pattern BRP4 and the first capacitor electrode CE1 and also between the fourth bridge pattern BRP4 and the first alignment electrode ELT1. The capacitors may be included in the storage capacitor Cst.

As described above, the first capacitor electrode CE1 and the second capacitor electrode CE2_1 (and the fourth bridge pattern BRP4) that is a doped semiconductor pattern (e.g., a partial area of the second semiconductor pattern ACT2) may form the first capacitor C1_1. The second capacitor CE2_1 (and the bridge pattern BRP4) and the first alignment electrode ELT1 may form the second capacitor C2_1. Therefore, the capacitance (or the capacity) of the storage capacitor Cst may be increased, and the sub-pixel may accurately emit light at a target luminance, so that the display quality can be enhanced.

Although in FIGS. 6 and 10 there has been described that each of the second capacitor electrodes CE2 and CE2_1 that is a common electrode of the first capacitor C1 and the second capacitor C2 is a gate electrode or a semiconductor pattern, the present disclosure is not limited thereto. For example, a portion of the common electrode may be formed in the same layer as the gate electrode, and a remaining portion of the common electrode may be formed of a semiconductor pattern.

Figure 11:
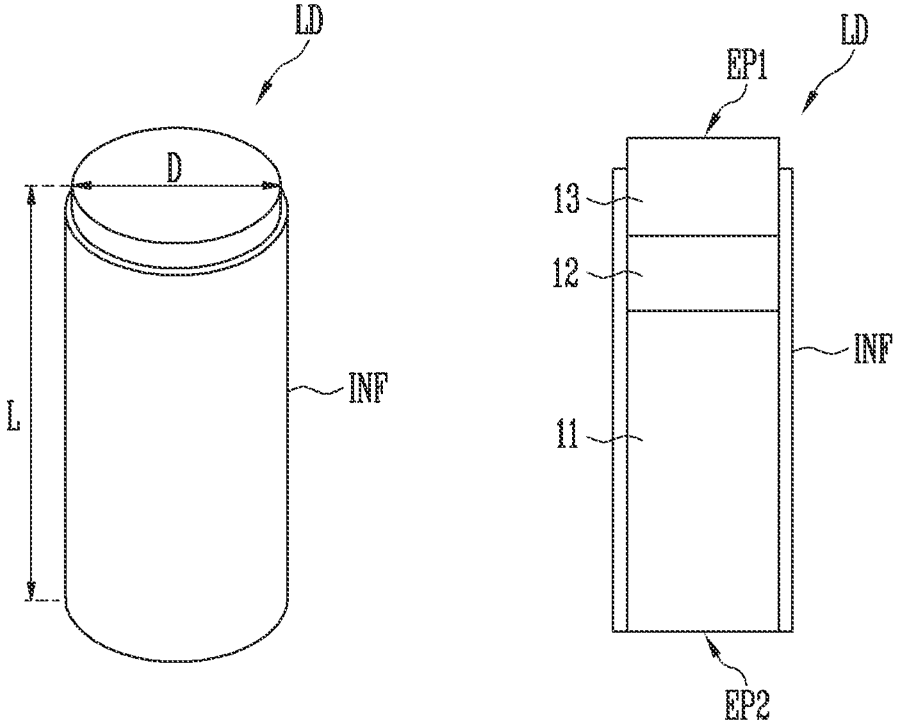
FIG. 11 is a diagram illustrating a light emitting element in accordance with one or more embodiments.

FIG. 11 is a diagram illustrating a light emitting element in accordance with one or more embodiments. Although FIG. 11 illustrates a pillar-type light emitting element LD, the type and/or shape of the light emitting element LD is not limited thereto.

Referring to FIG. 11, the light emitting element LD may include a first semiconductor layer 11, a second semiconductor layer 13, and an active layer 12 interposed between the first and second semiconductor layers 11 and 13. For example, if a direction in which the light emitting element LD extends refers to a longitudinal direction (L), the light emitting element LD may include the first semiconductor layer 11, the active layer 12, and the second semiconductor layer 13 that are successively stacked in the longitudinal direction (L).

The light emitting element LD may be provided in a pillar-like shape extending in one direction. The light emitting element LD may include a first end EP1 and a second end EP2. One of the first and second semiconductor layers 11 and 13 may be disposed on the first end EP1 of the light emitting element LD. The other one of the first and second semiconductor layers 11 and 13 may be disposed on the second end EP2 of the light emitting element LD.

In one or more embodiments, the light emitting element LD may be a light emitting element fabricated in the form of a pillar by an etching scheme or the like. In this specification, the term "pillar-type" embraces a rod-like shape and a bar-like shape such as a cylindrical shape and a prismatic shape extending in a longitudinal direction (i.e., to have an aspect ratio greater than 1), and the cross-sectional shape thereof is not limited to a particular shape. For example, the length L of the light emitting element LD may be greater than a diameter D thereof (or a width of the cross-section thereof).

The light emitting element LD may have a small size corresponding to a range from the nanometer scale to the micrometer scale. For example, the light emitting element LD may have a diameter D (or a width) and/or a length L ranging from the nanometer scale to the micrometer scale. However, the size of the light emitting element LD is not limited thereto, and the size of the light emitting element LD may be changed in various ways depending on design conditions of various devices, e.g., a display device, using a light emitting device with the light emitting element LD as a light source.

The first semiconductor layer 11 may be a first conductive semiconductor layer. For example, the first semiconductor layer 11 may include an n-type semiconductor layer. For instance, the first semiconductor layer 11 may include an n-type semiconductor layer that includes any one semiconductor material selected from among InAlGaN, GaN, AlGaN, InGaN, AlN, and InN, and is doped with a first conductive dopant such as Si, Ge, or Sn. However, the material for forming the first semiconductor layer 11 is not limited thereto, and the first semiconductor layer 11 may be formed of various other materials.

The active layer 12 may be disposed on the first semiconductor layer 11 and have a single-quantum well structure or a multi-quantum well structure. The location of the active layer 12 may be changed in various ways depending on the type of the light emitting element LD.

A cladding layer doped with a conductive dopant may be formed on and/or under the active layer 12. For example, the cladding layer may be formed of AlGaN or InAlGaN. In one or more embodiments, a material such as AlGaN or InAlGaN may be used to form the active layer 12, and various other materials may be used to form the active layer 12.

The second semiconductor layer 13 may be disposed on the active layer 12 and may include a semiconductor layer of a type different from that of the first semiconductor layer 11. For example, the second semiconductor layer 13 may include a p-type semiconductor layer. For instance, the second semiconductor layer 13 may include a p-type semiconductor layer that includes any one semiconductor material selected from among InAlGaN, GaN, AlGaN, InGaN, AlN, and InN, and is doped with a second conductive dopant such as Mg. However, the material for forming the second semiconductor layer 13 is not limited thereto, and various other materials may be used to form the second semiconductor layer 13.

If a voltage equal to or greater than a threshold voltage is applied between the opposite ends of the light emitting element LD, the light emitting element LD may emit light by coupling of electron-hole pairs in the active layer 12. Because light emission of the light emitting element LD can be controlled based on the foregoing principle, the light emitting element LD may be used as a light source of various light emitting devices as well as a pixel of the display device.

The light emitting element LD may further include an insulating film INF provided on a surface of the light emitting element LD. The insulating film INF may be formed on the surface of the light emitting element LD to enclose an outer surface (e.g., an outer peripheral or circumferential surface) of at least the active layer 12, and may further enclose one area of each of the first and second semiconductor layers 11 and 13.

In one or more embodiments, the insulating film INF may allow the opposite ends of the light emitting element LD that have different polarities to be exposed to the outside. For example, the insulating film INF may allow one end of each of the first and second semiconductor layers 11 and 13 disposed on the first and second ends EP1 and EP2 of the light emitting element LD to be exposed. In one or more embodiments, the insulating film INF may allow a side portion of each of the first and second semiconductor layers 11 and 13 adjacent to the first and second ends EP1 and EP2 of the light emitting element LD having different polarities to be exposed.

In one or more embodiments, the insulating film INF may have a single-layer structure or a multi-layer structure (e.g., a double-layer structure formed of aluminum oxide ($AlO_x$) and silicon oxide ($SiO_x$)) including at least one insulating material selected from among silicon oxide ($SiO_x$), silicon nitride ($SiN_x$), silicon oxynitride ($SiO_xN_y$), aluminum oxide ($AlO_x$), and titanium oxide ($TiO_x$)). However, the present disclosure is not limited thereto. In one or more embodiments, the insulating layer INF may be omitted.

In case that the insulating film INF is provided to cover the surface of the light emitting element LD, particularly, an outer surface (e.g., an outer peripheral or circumferential surface) of the active layer 12, the active layer 12 may be prevented from short-circuiting with a first pixel electrode or a second pixel electrode to be described below. Consequently, the electrical stability of the light emitting element LD may be secured.

If the insulating film INF is provided on the surface of the light emitting element LD, occurrence of a defect on the surface of the light emitting element LD may be reduced or minimized, whereby the lifetime and efficiency of the light emitting element LD may be improved. In addition, even in case that a plurality of light emitting elements LD are disposed adjacent to each other, an undesired short-circuit may be prevented from occurring between the light emitting elements LD.

In one or more embodiments, the light emitting element LD may further include an additional component as well as the first semiconductor layer 11, the active layer 12, the second semiconductor layer 13, and/or the insulating film INF that encloses the first semiconductor layer 11, the active layer 12, and the second semiconductor layer 13. For example, the light emitting element LD may further include at least one fluorescent layer, at least one active layer, at least one semiconductor layer and/or at least one electrode layer disposed on one end of the first semiconductor layer 11, the active layer 12, and/or the second semiconductor layer 13. For example, a contact electrode layer may be disposed on each of the first and second ends EP1 and EP2 of the light emitting element LD. Although FIG. 11 illustrates a pillar-type light emitting element LD, the type, the structure, and/or the shape of the light emitting element LD may be changed in various ways. For example, the light emitting element LD may be formed of a core-shell structure having a polypyramid shape.

A light emitting device including the light emitting element LD described above may be used not only in a display device but also in various devices that requires a light source. For instance, a plurality of light emitting elements LD may be disposed in each pixel of a display panel, so that the light emitting elements LD may be used as a light source of the pixel. However, the application field of the light emitting element LD is not limited to the foregoing examples. For example, the light emitting element LD may also be used in other types of devices such as a lighting device, which requires a light source.

In a display device in accordance with one or more embodiments of the present disclosure, a first alignment electrode and a second capacitor electrode that is a gate electrode or a doped semiconductor pattern may form a second capacitor. The second capacitor may be connected in parallel to the first capacitor to form a storage capacitor. Therefore, the capacitance (or the capacity) of the storage capacitor can be sufficiently increased.

Furthermore, the first alignment electrode may cover or shield the second capacitor electrode (or the gate electrode of a driving transistor). Hence, influence of an adjacent signal line and/or a power line on the second capacitor electrode may be removed. A data signal may be more accurately charged to or maintained in the storage capacitor. A sub-pixel may emit light at a target luminance. Thus, the quality of an image displayed on the display device can be enhanced.

The effects, aspects, and features of embodiments of the present disclosure are not limited by the foregoing, and other various effects, aspects, and features are anticipated herein.

While various embodiments have been described above, those skilled in the art will appreciate that various modifications, additions and substitutions are possible, without departing from the scope and spirit of the present disclosure.

Therefore, the embodiments disclosed in this specification are only for illustrative purposes rather than limiting the technical spirit of the present disclosure. The scope of the present disclosure must be defined by the accompanying claims and their equivalents.

What is claimed is:

1. A display device comprising:

a semiconductor pattern;

a first capacitor electrode under the semiconductor pattern;

a second capacitor electrode on the semiconductor pattern, the second capacitor electrode comprising a portion forming a gate electrode;

a first electrode and a second electrode at a same layer on the second capacitor electrode;

at least one light emitting element between the first electrode and the second electrode;

a first pixel electrode on the first electrode and connected to a first end of the at least one light emitting element; and a second pixel electrode on the second electrode and connected to a second end of the at least one light emitting element, the second pixel electrode being spaced apart from and not directly contact with the first pixel electrode, wherein the first electrode is electrically connected to the first capacitor electrode and the semiconductor pattern, wherein the semiconductor pattern and the gate electrode form a transistor, wherein a first capacitor is formed by the first capacitor electrode and the second capacitor electrode, and wherein a second capacitor is formed by the second capacitor electrode and the first electrode.

2. The display device according to claim 1, wherein a signal line and a power line are not at a layer between the second capacitor electrode and the first electrode.

3. The display device according to claim 2, wherein at least one of a source electrode or a drain electrode of the transistor is at a same layer as the second capacitor electrode.

4. The display device according to claim 2, wherein a data line connected to the transistor is at a same layer as the first capacitor electrode.

5. The display device according to claim 4, wherein the power line connected to the transistor is at a same layer as at least one of the first capacitor electrode or the second capacitor electrode.

6. The display device according to claim 1, wherein the first pixel electrode is electrically connected to the transistor by the first electrode.

7. The display device according to claim 1, further comprising a bridge electrode at a same layer as the first electrode and the second electrode, and spaced from the first electrode and the second electrode, wherein the second pixel electrode is connected to a power line by the bridge electrode.

8. The display device according to claim 7, wherein, in a plan view, the second electrode extends over a plurality of sub-pixels, and wherein each of the first electrode and the bridge electrode has an island shape in each of the sub-pixels.

9. The display device according to claim 7, wherein a first insulating layer is on the first electrode and the second electrode, and wherein the first insulating layer is not in a boundary area between two adjacent sub-pixels from among a plurality of sub-pixels.

10. The display device according to claim 1, wherein, in a plan view, the first electrode covers the first capacitor electrode and the second capacitor electrode.

11. The display device according to claim 10, wherein the first electrode is connected to the first capacitor electrode and the semiconductor pattern through an opening of the second capacitor electrode.

12. The display device according to claim 1, further comprising:

a wavelength conversion pattern on the at least one light emitting element, and configured to convert a wavelength band of light that is incident thereon from the at least one light emitting element to a desired wavelength band and emit the light; and a color filter on the wavelength conversion pattern.

13. The display device according to claim 1, wherein the at least one light emitting element comprises inorganic light emitting diodes connected in parallel to each other.

14. A display device comprising:

a semiconductor pattern;

a first capacitor electrode under the semiconductor pattern;

a gate electrode on the semiconductor pattern;

a first electrode and a second electrode at a same layer on the gate electrode;

at least one light emitting element between the first electrode and the second electrode;

a first pixel electrode on the first electrode and connected to a first end of the at least one light emitting element; and a second pixel electrode on the second electrode and connected to a second end of the at least one light emitting element, the second pixel electrode being spaced apart from and not directly contact with the first pixel electrode, wherein the first electrode is electrically connected to the first capacitor electrode and the semiconductor pattern, wherein the semiconductor pattern and the gate electrode form a transistor, wherein a portion of the semiconductor pattern doped with an impurity forms a second capacitor electrode, wherein a first capacitor is formed by the first capacitor electrode and the second capacitor electrode, and wherein a second capacitor is formed by the second capacitor electrode and the first electrode that overlaps the second capacitor electrode.

15. The display device according to claim 14, wherein the gate electrode is electrically connected to the second capacitor electrode.

16. The display device according to claim 14, wherein a signal line and a power line are not at a layer between the second capacitor electrode and the gate electrode.

17. The display device according to claim 16, wherein each of a data line and the power line that are connected to the transistor is at a same layer as at least one of the first capacitor electrode or the second capacitor electrode.

18. The display device according to claim 14, further comprising a bridge electrode at a same layer as the first electrode and the second electrode, and spaced from the first electrode and the second electrode, wherein the second pixel electrode is connected to a power line by the bridge electrode.

19. The display device according to claim 18, wherein a first insulating layer is on the first electrode and the second electrode, and wherein the first insulating layer is not in a boundary area between two adjacent sub-pixels from among a plurality of sub-pixels.

20. The display device according to claim 14, wherein, in a plan view, the first electrode covers the first capacitor electrode and the second capacitor electrode.

* * * * *